United States Patent [19]
Doi

[11] Patent Number: 6,103,359
[45] Date of Patent: Aug. 15, 2000

[54] PROCESS AND APPARATUS FOR MANUFACTURING AN ANISOTROPIC CONDUCTOR SHEET AND A MAGNETIC MOLD PIECE FOR THE SAME

[75] Inventor: Hideyuki Doi, Ibaraki, Japan

[73] Assignee: JSR Corporation, Tokyo, Japan

[21] Appl. No.: 08/859,031

[22] Filed: May 20, 1997

[30] Foreign Application Priority Data

May 22, 1996 [JP] Japan ................................. 8-127512

[51] Int. Cl.$^7$ ........................................................ B32B 5/16
[52] U.S. Cl. ...................... 428/323; 174/262; 335/210; 335/284; 428/328; 428/692
[58] Field of Search ............... 264/24; 174/262; 335/210, 284; 428/323, 328, 692, 900

[56] References Cited

U.S. PATENT DOCUMENTS

| | | | |
|---|---|---|---|
| 3,634,602 | 1/1972 | Bruck | 174/262 |
| 3,744,041 | 7/1973 | Higashinakagawa et al. | 340/174 BC |
| 3,939,312 | 2/1976 | McKay | 179/115.5 |
| 4,292,261 | 9/1981 | Kotani et al. | 264/24 |
| 4,477,790 | 10/1984 | Moritz | 336/60 |
| 4,529,954 | 7/1985 | Steingroever et al. | 335/284 |
| 4,729,166 | 3/1988 | Lee et al. | 29/877 |
| 4,740,657 | 4/1988 | Tsukagoshi et al. | 174/88 R |
| 4,751,598 | 6/1988 | Hamilton | 360/110 |
| 4,800,353 | 1/1989 | Csonka et al. | 335/210 |
| 4,832,455 | 5/1989 | Takeno et al. | 350/334 |
| 4,977,007 | 12/1990 | Kondo et al. | 428/76 |
| 4,977,384 | 12/1990 | Tatchyn et al. | 335/210 |
| 5,184,233 | 2/1993 | Lim et al. | 359/46 |
| 5,304,460 | 4/1994 | Fulton et al. | 430/311 |
| 5,528,820 | 6/1996 | Collier | 29/605 |
| 5,591,480 | 1/1997 | Weisman et al. | 216/13 |

FOREIGN PATENT DOCUMENTS

| | | |
|---|---|---|
| 51-93393 | 8/1976 | Japan . |
| 53-147772 | 12/1978 | Japan . |
| 54-146873 | 11/1979 | Japan . |
| 56-48951 | 11/1981 | Japan . |
| 7-105741 | 4/1995 | Japan . |
| 8-124646 | 5/1996 | Japan . |

*Primary Examiner*—Hoa T. Le
*Attorney, Agent, or Firm*—Oblon, Spivak, McClelland, Maier & Neustadt, P.C.

[57] ABSTRACT

When a sheet is molded with an anisotropic conductor sheet molding mold having a plurality of magnetic micropoles, ferromagnetic particles are localized in a state in which the magnetic field intensity distribution in a sheet molding space shows the maximum substantially on the central axis of each pair of opposing magnetic micropoles, whereby an anisotropic conductor sheet containing ferromagnetic particle aggregate portions free of any low-density parts in the particle distribution, when viewed from above a sheet surface, can be obtained. This anisotropic conductor sheet is low in conduction resistance and capable of attaining a good electric connection by a little compression dislocation thereof.

7 Claims, 21 Drawing Sheets

[POSITION OF MEASUREMENT]
DISTANCE FROM SURFACE OF MAGNETIC POLE
a··· 5% OF OPPOSING MAGNETIC POLE DISTANCE
b···15% OF OPPOSING MAGNETIC POLE DISTANCE
c···25% OF OPPOSING MAGNETIC POLE DISTANCE
d···45% OF OPPOSING MAGNETIC POLE DISTANCE

[POSITION OF MEASUREMENT]
DISTANCE FROM SURFACE OF MAGNETIC POLE
a··· 5% OF OPPOSING MAGNETIC POLE DISTANCE
b···15% OF OPPOSING MAGNETIC POLE DISTANCE
c···25% OF OPPOSING MAGNETIC POLE DISTANCE
d···45% OF OPPOSING MAGNETIC POLE DISTANCE

[POSITION OF MEASUREMENT]
DISTANCE FROM SURFACE OF MAGNETIC POLE
a ··· 5% OF OPPOSING MAGNETIC POLE DISTANCE
b ··· 10% OF OPPOSING MAGNETIC POLE DISTANCE
c ··· 15% OF OPPOSING MAGNETIC POLE DISTANCE
d ··· 25% OF OPPOSING MAGNETIC POLE DISTANCE
e ··· 45% OF OPPOSING MAGNETIC POLE DISTANCE

[POSITION OF MEASUREMENT]
DISTANCE FROM SURFACE OF MAGNETIC POLE
a··· 5% OF OPPOSING MAGNETIC POLE DISTANCE
b···15% OF OPPOSING MAGNETIC POLE DISTANCE
c···25% OF OPPOSING MAGNETIC POLE DISTANCE
d···45% OF OPPOSING MAGNETIC POLE DISTANCE

PROCESS AND APPARATUS FOR MANUFACTURING AN ANISOTROPIC CONDUCTOR SHEET AND A MAGNETIC MOLD PIECE FOR THE SAME

BACKGROUND OF THE INVENTION

FIELD OF THE INVENTION

The present invention relates to an anisotropic conductor sheet for use particularly in attaining fine multipoint electric connection in an IC and printed circuit board inspection tool, a mountable IC socket and a printed circuit board connector, or an IC card connector in the periphery thereof, a process for producing the same, equipment for producing the same, and a magnetic pole mold piece for the same.

The anisotropic conductor sheet of the present invention has good conductivity and pressure sensitive conductivity in the thicknesswise direction thereof. The technical fields where this sheet is suitably utilizable according to each of the above-mentioned properties thereof, if explained in more detail, are as follows:

(Fields where the good conductivity is particularly utilizable)

(1) sockets for electric connection of integrated circuits such as IC, LSI, MCM, etc., particularly BGA sockets.

(2) LCD panel connector.

(3) connector mountable in printed circuit board.

(4) PC card terminal and connector.

(5) adhesive anisotropic conductor sheet, adhesive anisotropic conductor tape, pressure sensitive adhesive anisotropic conductor sheet, and pressure sensitive adhesive anisotropic conductor tape.

(6) sheet probe for IC inspection and printed circuit board inspection.

(Fields where the good pressure sensitive conductivity is particularly utilizable)

(7) pressure sensitive switch, limit switch, and keyboard.

(8) pressure sensitive volume, clavier, coordinate input device, and joy stick.

(9) touch sensor.

(10) pressure distribution measurement sensor.

DISCUSSION OF THE BACKGROUND

Anisotropic conductor sheets for use in the foregoing technical fields are those having a conductivity only in the thicknesswise direction thereof, and those having a large number of pressure sensitive conductive conductor portions capable of exhibiting a conductivity only in the thicknesswise direction thereof when pressed. Various known structures of such sheets are disclosed, for example, in Japanese Patent Application Publication No. 48,951/1981, Japanese Patent Application Laid-open No. 93,393/1976, Japanese Patent Application Laid-open No. 147,772/1978, Japanese Patent Application Laid-open No. 146,873/1979, Japanese Patent Application Laid-open No. 105,741/1995, and U.S. Pat. No. 4,292,261.

A description will now be made of outlines of conventional anisotropic conductor sheets and methods of producing the same.

When an anisotropic conductor sheet is viewed from above a surface thereof, a large number of insular or zonal conductor portions 2 are formed, for example, in a silicone rubber sheet of about 1 mm in thickness as shown in FIG. 1 or 2. An enlarged model diagram of a cross section of the sheet is shown in FIG. 3. In FIG. 3, the conductor portions 2 are formed, for example, of aggregates of a plurality of rows of nickel particles continuously strung in the thicknesswise direction of the sheet. This sheet has a conductivity in the thicknesswise direction thereof but no conductivity in any direction parallel with the major surfaces of the sheet, i.e., in any surfacewise direction thereof, and is therefore called an anisotropic conductor sheet.

A method of producing such an anisotropic conductor sheet will be described while referring to FIG. 4. A mold 5 (constituted of a pair of a top force and a bottom force) made of a ferromagnetic material is placed between a pair of magnetic poles 3 and 4 of an electromagnet. A mixture of a liquid silicone rubber and nickel particles (molding material 7) is placed in a space (chamber; molding space) surrounded by the mold 5 and a spacer 6, and subjected to the action of magnetic fields to draw up nickel particles in lines in the directions of the magnetic fields between respective pairs of magnetic pole portions M. The above-mentioned space (chamber) is in a flat form, and is used for molding of a sheet. When the liquid silicone rubber is heated and cured in such a state, an anisotropic conductor sheet is formed. In FIG. 4, the mold 5 is constituted of mold substrates 8, magnetic pole portions M and nonmagnetic material portions N existing around the magnetic pole portions M embedded therein. The nonmagnetic pole portions N are made of, for example, a heat-resistant resin such as an epoxy resin or a phenolic resin. The surfaces of the magnetic pole portions M are usually horizontally flush with the surfaces of the nonmagnetic material portions. When a magnetic field is applied with the existence of the magnetic pole portions M and the nonmagnetic material portions N, conductive ferromagnetic particles (e.g., nickel particles) are concentrated near the magnetic pole portions M, whereby the conductor portions 2 are formed to be in an insular or zonal form in conformity with the form of the magnetic pole portions M when viewed from above a surface of the sheet.

In the case where use is made of a mold having wholly flat surface portions as the magnetic pole portions M without any nonmagnetic material portions N, conductive ferromagnetic particles are also drawn up in the thicknesswise direction of the resulting sheet, and are uniformly and thinly distributed at random in the surfacewise directions thereof. Thus, an anisotropic conductor sheet having a conductivity only in the thicknesswise direction thereof is obtained. In this case, the sheet has a conductivity all across the sheet, but has a high conduction resistance.

By contrast, the anisotropic conductor sheet as shown in FIG. 1 or 2 has the insular or zonal conductor portions 2 wherein conductive ferromagnetic particles are localized at a higher density to make the conductor portions low in conduction resistance.

The present invention is directed to an anisotropic conductor sheet of the latter type (FIGS. 1 and 2) wherein the conduction resistance thereof is further lowered. Additionally stated, anisotropic conductor sheets include those making the most of the pressure sensitive conductivity thereof due to the rubber elasticity of the sheet material, and those merely making the most of the good conductivity thereof. However, both types are the same as each other in basic constitution. Thus, the present invention is not limited to one of the two types.

The technology of producing the foregoing anisotropic conductor sheet is described in Japanese Patent Application Laid-open No. 146,873/1979. Junior patents directed to an anisotropic conductor sheet have been laid open, but the basics of the manufacturing technologies thereof are not beyond those of Japanese Patent Application Laid-open No. 146,873/1979.

Additionally stated, although the anisotropic conductor sheet of the aforementioned example has the conductor portions thereof horizontally flush with the insulator portions thereof, such an anisotropic conductor sheet as described in Japanese Patent Application Laid-open No. 105,741/1995 will also suffice, wherein the conductor portions thereof are either in a little protuberant form standing out from the surfaces of the insulator portions thereof or in a concave or recessed form.

Meanwhile, the conduction resistances of the conventional anisotropic conductor sheets are considerably higher than a value expected from the conduction resistance of an aggregate of conductive particles alone. Thus, there is now a demand for further lowering the conduction resistance of an anisotropic conductor sheet.

Results of microscopic observation of a conductor portion of an anisotropic conductor sheet produced according to the representative prior art technology as disclosed in Japanese Patent Application Laid-open No. 146,873/1979 are shown in FIGS. 5 to 7. As shown in FIG. 5A, which is an enlarged model diagram of a conductor portion viewed from above a major surface of the sheet, and in FIG. 5B, which is an enlarged model diagram of a cross section, in the thicknesswise direction of the sheet, of a central portion of a conductor portion (also showing magnetic pole portions), conductive ferromagnetic particles 11 are arranged in the thicknesswise direction of the sheet to form rows 12 of conductive ferromagnetic particles. The conductivity in the thicknesswise direction of the sheet is realized by such rows 12 of particles. However, such rows 12 of particles are not homogeneously present at a desired location (portion sandwiched between opposing magnetic pole portions M and M), i.e., a conductor portion 2, but the particles are aggregated in such a hyperboloidlike drumlike form in a longitudinal cross-sectional structure that the aggregate state near the magnetic pole portions M, i.e., in the surface portions of each conductor potion 2 of the sheet, is sparse in central portions of the surface portions of the conductor portion 2 as can be seen in FIG. 5B. Further, some conventional anisotropic conductor sheet has conductor portions 2 wherein partly small masses in a row 11 of particles are formed and a plurality of such small masses are nonuniformly gathered to form each of the conductor portions 2. Such an aggregate state of conductive ferromagnetic particles 11 is believed to be a cause of incapability of lowering the conduction resistance of the conductor portions 2. The conduction resistance of the conventional anisotropic conductor sheet 10 is unsatisfactory for use in mounting this sheet 10 in an electric circuit such as a socket or a connector. Further, in the case of the conventional anisotropic conductor sheet 10, since conductive ferromagnetic particles 11 are not densely and uniformly aggregated in each conductor portion 2 to which a conductivity is desired to be imparted, as described hereinabove, but, so to speak, are in a state of extending beyond the periphery of the conductor portion 2 to narrow the distance between that conductor portion and adjacent conductor portions to thereby involve a fear of short circuit, the gap length (hereinafter referred to as the "magnetic pole pitch") between the adjacent conductor portions 2 and 2 cannot be further narrowed, whereby the density of the conductor portions 2 per given area of the sheet 10 cannot be heightened. Furthermore, for the same reason, a sheet having a thickness exceeding the magnetic pole pitch cannot be molded.

SUMMARY OF THE INVENTION

The present invention has been made in view of the foregoing circumstances of the prior art. A first object of the present invention is to provide an anisotropic conductor sheet so low in conduction resistance that it can be used for mounting the same in an electric circuit such as a socket or a connector. A second object of the present invention is to provide an anisotropic conductor sheet wherein conductive ferromagnetic particles are densely localized up to the central portions of the conductor portions of the sheet. A third object of the present invention is to provide an anisotropic conductor sheet wherein the distance between the centers of adjacent conductor portions 2 (magnetic pole pitch) is very short with electrical insulation between the conductor portions and with no substantial existence of conductive particles in the portions other than the conductor portions. Further, a fourth object of the present invention is to provide a pressure sensitive conductive anisotropic conductor sheet capable of attaining a good electric connection by a little compression dislocation. Still further, a fifth object of the present invention is to provide an anisotropic conductor sheet having a large thickness.

As a result of intensive investigations with a view to attaining the foregoing objects, the inventor of the present invention has obtained the following findings.

The reason why the aggregate state of conductive ferromagnetic particles is nonuniform in the conductor portions of any conventional anisotropic conductor sheet is that the magnetic field intensity distribution in a mold for molding an anisotropic conductor sheet has the maximum in the peripheral portion of each magnetic pole portion of the mold. Further examination has been made of conventional anisotropic conductor sheets having a structure as shown in FIGS. 6A, 6B, 7A and 7B, and molds for producing the same. In the anisotropic conductor sheet of FIG. 6, the distribution state of conductive ferromagnetic particles 11 in a conductor portion 2 is such that they are not localized only between the magnetic pole portions M but some conductive ferromagnetic particles 11' remain therearound. In the anisotropic conductor sheet of FIG. 7, which is produced as shown in FIG. 7B, aggregates of conductive ferromagnetic particles are nonuniformly distributed with gaps therebetween as shown in FIG. 7A when the sheet is viewed from above the upper side thereof. Further, in this case, a central part where conductive ferromagnetic particles are sparse in each conductor portion is developed near the surface of one side of the sheet as shown in FIG. 7B when the sheet is viewed from below the lower side thereof.

The force acting on a ferromagnetic particle in a magnetic field is proportional to the product of the magnetic field intensity and the magnetic field gradient at a site where the ferromagnetic particle exists, and changes in sign at the site of the maximum magnetic field gradient in the magnetic field intensity distribution. Accordingly, ferromagnetic particles existing around the site of the maximum in the magnetic field intensity distribution undergo the force directed toward that site of the maximum. In other words, if the maximum exists in the magnetic field intensity distribution, ferromagnetic particles are localized near the site of the maximum.

The hyperboloidlike aggregate form of the ferromagnetic particles 11 in the conductor portion 2 as shown in FIG. 5 can be explained as in the following: Since the maximum exists in the magnetic field intensity distribution on any imaginary plane of the sheet near the surface of a magnetic pole while corresponding to the peripheral location of the magnetic pole, ferromagnetic particles 11 are localized in a location corresponding to the peripheral location of the magnetic pole. Thus, a central part where ferromagnetic particles 11 are sparse in the conductor portion 2 exists, as is recognizable when the conductor portion 2 of the anisotropic conductor sheet 10 is observed from above a surface thereof. On the other hand, since the maximum in the location corresponding to the peripheral location of the magnetic pole disappears and the maximum in a location corresponding to a central location of the magnetic pole appears in any imaginary horizontal plane of the sheet in the middle position between opposing magnetic poles (see FIG. 12), ferromagnetic particles 11 are localized in the central location of the sheet substantially corresponding to the central location of the magnetic poles. The form of magnetic field intensity distribution continuously changes between the foregoing two forms of magnetic field intensity distribution in intermediate imaginary planes between the above-mentioned two imaginary planes to constitute a drumlike profile of distributed ferromagnetic particles.

In the case of the sheet as shown in FIG. 6, which is produced with magnetic pole portions M having a small diameter, conductive ferromagnetic particles 11 densely exist up to a central portion of each conductor portion 2 while involving nonlocalized conductive ferromagnetic particles 11 remaining between that conductor portion 2 and adjacent conductor portions. Such an aggregate form of particles 11 can be explained as in the following. The maximum in a location corresponding to a peripheral location of a magnetic pole exists in the magnetic field intensity distribution on any imaginary plane near the surface of a magnetic pole like in the case of FIG. 5. Since the diameter of the magnetic pole is decreased to make the sites of the maximum in the peripheral location of the magnetic pole approach one another to thereby increase the magnetic field intensity in a central part of the magnetic pole to a substantial flatness, the force for localizing conductive ferromagnetic particles existing between opposing magnetic poles M—M toward a portion of the sheet corresponding to the peripheral locations of the magnetic poles is decreased, whereby some conductive ferromagnetic particles 11 can be pushed up to a portion of the sheet corresponding to the central positions of the magnetic poles by virtue of the force of ferromagnetic particles being localized from outside into positions of the sheet corresponding to the peripheral location of the magnetic poles. On the other hand, since domains where the magnetic field intensity and the magnetic field gradient are both low are increased between the portions of the sheet corresponding to the adjacent magnetic poles because the diameter of the magnetic poles is decreased, the force acting on conductive ferromagnetic particles existing in these domains is so weak that ferromagnetic particles incapable of being localized remain in these domains.

As disclosed in Japanese Patent Application Laid-open No. 105,741/1995, the anisotropic conductor sheet of FIG. 7 is molded in such a way that the conductor portions 2 of the anisotropic conductor sheet 10 are each in a protuberant form. In this case, a molding space is formed by placing insulating sheets P having openings smaller than the magnetic pole portions M. In a mold for this sheet, the diameter of the magnetic pole portions M is so larger than the diameter of the protuberant form that no maximum of magnetic field intensity distribution is present in each of the protuberant locations with a substantially uniform magnetic field intensity distribution in each location of the sheet on the inside of the periphery of each magnetic pole portion, whereby conductive ferromagnetic particles 11 are chainlike put together in the vertical direction to form rows thereof. In this case, however, the force for gathering the rows is so weak that small masses are nonuniformly distributed. This mode of distribution of conductive ferromagnetic particles 11 is similar to the mode of distribution of conductive ferromagnetic particles in an anisotropic conductor sheet molded with a mold having magnetic pole portions each having a wholly flat surface without nonmagnetic material portions.

Thus, it has been found out that the reason why conductive ferromagnetic particles are not uniformly and densely aggregated up to the central portion of each conductor portion in any conventional anisotropic conductor sheet lies in that the Z axis constituent of the magnetic field intensity distribution is maximum in conformity with the peripheral location of each magnetic micropole in the case of any conventional mold for molding an anisotropic conductor sheet as shown in FIG. 5, and in that a major factor in governing such a form of magnetic field intensity distribution is the shape of the magnetic micropoles of the mold.

In order to clarify the relationship between this factor and the shape of conductor portions, a pair of model mold pieces (upper force and bottom force) having each of four kinds of shapes of vertical cross sections (cross sections vertical to magnetic pole surfaces) of magnetic pole portions as shown in FIG. 8 (rectangular; conventional mold pieces), FIG. 9 (rectangular cross section with rounded corners of the top), FIG. 10 (shape having the tip of a semicircular top horizontally cut away), and FIG. 11 (with a semicircular top) were produced, and placed in an external vertical magnetic field developed by a magnet to measure the Z axis component (vertical component) of the magnetic field intensity distribution in the mold. Irrespective of shape, the dimensions of the mold used for measurement were such that the magnetic pole width was 10 mm, the magnetic pole height was 10 mm, the magnetic pole pitch was 20 mm, and the distance between the magnetic pole surface of the upper force and the magnetic pole surface of the bottom force (hereinafter referred to simply as the "opposing magnetic pole distance") was 10 mm. Further, four imaginary planes respectively positioned apart by 5%, 15%, 25% and 45% of the opposing magnetic pole distance from the magnetic pole surface of the bottom force were selected as the positions of measurement of the magnetic field intensity distribution. A Hall element was used as a magnetic field sensor for scanning measurement. The results of respective measurements are shown in FIG. 12, FIG. 13, FIG. 14, and FIG. 15. Although the results of measurements are not shown herein, the same measurements were carried out using magnetic poles with a pinnacled cross section, a trapezoidal cross section, or a trapezoidal but tip-round cross section.

The following matters have been clarified from the results of such a series of measurements. (1) In the case of magnetic poles with a rectangular cross section in the same shape as in the conventional molds as shown in FIG. 8, the magnetic field intensity distribution on the plane (a) apart by 5% of the opposing magnetic pole distance from the magnetic pole surface of the bottom force changed sharply to the maximum in a location of the plane corresponding to the periphery of the magnetic poles as shown in FIG. 12. The magnetic field intensity distribution on the plane (b) apart by 15% from the magnetic pole surface of the bottom force changed gently to the maximum in the above-mentioned location. In either of the magnetic field intensity distributions on the planes (c) and (d) apart by 25% and 45% respectively from the magnetic pole surface of the bottom force, the maximum disappeared in the above-mentioned location, but a new maximum appeared in a position corresponding to the centers of the magnetic poles. A variety of modes of localization of conductive ferromagnetic particles in the conductor portions of the anisotropic conductor sheets molded with the conventional molds can be explained from these findings. (2) In the case of magnetic poles with a rectangular cross section with rounded corners of the top (horizontal straight line portion: 60%, rounded portion on each of both sides: 20%) as shown in FIG. 9, the maximum of the magnetic field intensity distribution on the plane (a) apart by 5% of the opposing magnetic pole distance from the magnetic pole surface of the bottom force shifted by the length of the rounded portion from the location corresponding to the periphery of the magnetic poles, if rectangular in cross section, to the location of a plane-to-curved surface change in the surfaces of the magnetic poles with a gentle magnetic field gradient in the location corresponding to the peripheral portions of the magnetic poles. Further, the peak height was decreased, while the magnetic field intensity in the central portion was increased. In the magnetic field intensity distribution on the plane (b) apart by 15% from the magnetic pole surface of the bottom force, the above-mentioned maximum disappeared to become flat. In either of the magnetic field intensity distributions on the planes (c) and (d) apart by 25% and 45% respectively from the magnetic pole surface of the bottom force, a new maximum appeared in a position corresponding to the centers of the magnetic poles. Such a change in the form of magnetic field intensity distribution by rounding the corners of the rectangular magnetic poles is continuous in such a way that it results in a magnetic field intensity distribution (FIG. 15) in the case of magnetic poles in an ultimate magnetic pole shape having 50% each of round portions on both sides without a horizontal straight line portion in cross section, i.e., magnetic poles with a semicircular top in cross section, as a result of enlargement of the rounded portions. (3) In the case of magnetic poles with a semicircular top in cross section, part of which was formed into a horizontal straight line portion (30% of the maximum horizontal width) as shown in FIG. 10, two small peaks of the maximum appeared only in the magnetic field intensity distribution on the plane (a) apart by 5% of the opposing magnetic pole distance from the magnetic pole surface of the bottom force as shown in FIG. 14, but the above-mentioned maximum disappeared in the magnetic field intensity distribution on the plane (b) apart by 10% from the magnetic pole surface of the bottom force, while the form of magnetic field intensity distribution on the plane (c) apart by 15% from the magnetic pole surface of the bottom force became the same as in the case of magnetic poles with a semicircular top in cross section (FIG. 15), as shown in FIG. 14. (4) In the case of magnetic poles with a semicircular top in cross section as shown in FIG. 11, the magnetic field intensity distributions were as shown in FIG. 15. In this case, the position of the maximum in the magnetic field intensity distribution is on the axis in the direction Z in the central position of the magnetic poles no matter what position between the opposing magnetic poles the imaginary horizontal plane may be in.

The present invention has been made based on the foregoing findings. The anisotropic conductor sheet according to claim 1 of the present invention is a sheet member comprising an insulator portion and a plurality of conductor portions surrounded by the insulator portion; characterized in that the conductor portions are made of respective aggregates of conductive ferromagnetic particles arranged in the thicknesswise direction of the sheet, in that the minimum width of the aggregates is smaller than 10 mm, and in that the aggregate density of the conductive ferromagnetic particles is uniform all across the respective aggregates when viewed from above a major surface of the sheet. The term "uniform aggregate density" as used herein is intended to indicate a state in which particles are uniformly distributed as shown in FIG. 16 or 21 when an area of each aggregate is observed in enlarged view. Specifically, the particle dispersion state of each aggregate portion is a uniform state in which no particle-free portion is recognized. The cases of FIGS. 5A, 6A, and 7A are examples of a nonuniform state. The term "minimum width of the aggregates" as used herein is intended to mean the diameter of a circle as in the case of a circular (insular) conductor portion, or the length of the short side of a rectangle or, in other words, the thickness of a line or a zone as in the case of a rectangular (linear or zonal) conductor portion in the conductor portions 2 as in FIG. 2.

On the other hand, the process for producing an anisotropic conductor sheet according claim 2 of the present invention is a method comprising providing a molding space between a pair of opposing magnetic pole mold pieces each provided with a plurality of magnetic micropoles made of a ferromagnetic material for localization of magnetic fields, placing a molding material containing conductive ferromagnetic particles dispersed in a curable material flowable under molding conditions in the molding space, and localizing the conductive ferromagnetic particles in the molding material with the pair of the magnetic pole mold pieces while curing the molding material to produce an anisotropic conductor sheet; characterized in that the constituent vertical to the magnetic pole surfaces of the magnetic pole mold pieces (Z axis component) in the magnetic field intensity distribution on any plane parallel with the magnetic pole surfaces of the magnetic pole mold pieces in the molding space shows the maximum substantially on the central axis of each magnetic micropole M on every plane parallel with the magnetic pole surfaces along the thicknesswise direction of the molding space. More specifically, when the shape of the magnetic micropoles is as shown in FIG. 11, the magnetic field intensity distribution in every plane parallel with the magnetic pole surfaces between the opposing magnetic micropoles shows the maximum on the central axis of the magnetic micropoles as shown in FIG. 15. When the shape of the magnetic micropoles is as shown either in FIG. 9 or in FIG. 10, the magnetic field intensity distribution on each of the planes apart by 20% and 10% of the opposing magnetic pole distance from one of the magnetic pole surfaces shows the maximum on the central axis of the magnetic micropoles. Such a space is used as the molding space in which the molding material is placed, subjected to the action of magnetic fields, and cured according to the invention of claim 2. Additionally stated, localization of conductive ferromagnetic particles is preferably uniform in claim 2. In this case, the term "uniform localization" is intended to mean that the aggregate density of particles in conductor portions made of respective aggregates of conductive ferromagnetic particles is uniform as described in connection with claim 1.

On the other hand, the equipment for production of an anisotorpic conductive sheet according to claim 3 of the present invention is equipment for producing an anisotropic conductor sheet, comprising a pair of opposing magnetic pole mold pieces provided with a plurality of magnetic micropoles made of a ferromagnetic material for localization of magnetic fields between a pair of magnets, wherein a molding material containing conductive ferromagnetic particles dispersed in a curable material flowable under molding conditions is placed between the pair of the magnetic pole mold pieces, the conductive ferromagnetic particles in the molding material are localized with the pair of the magnetic pole mold pieces, and the molding material is heated and cured with a heating means; characterized in that the cross-sectional form of each magnetic micropole along at least one plane vertical to the surfaces of the magnetic pole mold pieces is at least one form selected from between (a) a form decreased in width toward the tip thereof with an increase in the width-decreasing rate and with nonexistence of any horizontal straight line portion in the tip portion thereof, and (b) a form decreased in width toward the tip thereof with an increase in the width-decreasing rate and with existence of a horizontal straight line portion shorter than 50% of the maximum horizontal width of the cross-sectional form at the tip thereof.

An example of the form (a) is part of a circle or an ellipse (representatively half thereof) as the cross-sectional form as shown in FIG. 11. An example of the form (b) is a cross-sectional form decreased in width toward the tip thereof like a convex curve and having a horizontal straight line portion at the tip thereof. This example is preferred for carrying out the invention of claim 1 or 2 because the peaks in the magnetic field intensity distribution become one peak on the central axis of each magnetic micropole where the distance from the surface of that magnetic pole is at least 10% of the opposing magnetic pole distance. The horizontal straight line portion of the form (b) has a length smaller than 50%, preferably smaller than 30%, of the maximum horizontal width of the cross-sectional form (i.e., this width means the width of the thickest portion of a magnetic micropole M, which is usually the bottom of the magnetic micropole, but is the thickest portion in the case where the magnetic micropole is thickest on a middle level thereof). Further, the connection points of the convex curve portions with the horizontal straight line portion are preferably continuous (e.g., like an arc and a tangential line). When the length of the horizontal straight line portion is 30% of the maximum horizontal width, the peaks in the magnetic field intensity distribution become one peak where the distance from the surface of each magnetic micropole is at least 10% of the opposing magnetic pole distance. Accordingly, spacers S having a length of at least 10% of the opposing magnetic pole distance are sandwiched between the magnetic micropole 53a and the molding material, whereby an anisotorpic conductor sheet having conductive ferromagnetic particles well localized can be molded.

Further, the magnetic pole mold piece according to claim 4 of the present invention for localization of ferromagnetic particles is characterized by comprising magnetic micropoles made of a ferromagnetic material, having a preliminarily formed spherical top portion, and fixed in surfacewise arrangement.

Examples of the "magnetic micropole having a preliminarily formed spherical top portion" include an iron sphere (diameter: at most 10 and several mm), and an iron column (diameter: 10 and several mm, length: 1 to several times as long as the diameter) having one rounded end present in the longer axial direction. Besides the spherical shape and the columnar shape having one rounded end as mentioned above, other examples include a columnar shape having both rounded ends (the columnar shape is selected from among a square column, a circular column, polygonal columns, etc.), an oval shape, and a wiry shape circular or elliptic in cross section. Herein, wiry magnetic micropoles are fixed with the longer axial direction thereof parallel with the major surface of a mold. The term "surfacewise" as used herein usually indicates a "plane" but may indicate "part of a spherical surface." The arrangement of magnetic micropoles may arbitrarily be designed in accordance with the pattern of aggregates of conductive ferromagnetic particles in the anisotropic conductor sheet. When aggregates are designed to be linear, wiry ferromagnetic materials are used as the magnetic micropoles. A plate of a nonmagnetic material such for example as aluminum, copper, brass, stainless steel or a resin is used for fixing magnetic micropoles therein. In an example of the fixing method, such a plate, after provided with holes in which the magnetic micropoles are fitted, is used. Fixation of the magnetic micropoles may alternatively be done using a liquid curable resin such for example as a liquid epoxy resin. The fixing method is not limited to these examples, and any known conventional methods may alternatively be used.

FIGS. 22A and 22B show model diagrams in the case of using spherical magnetic micropoles. In FIG. 22, numeral 40 refers to a magnetic pole plate (mold substrate made of a ferromagnetic material), 41 to spherical magnetic micropoles, and 42 to a plate made of a nonmagnetic material for arrangement and fixation of the magnetic micropoles 41 on the magnetic pole plate 40.

The fifth object of the present invention, i.e., "to provide an anisotropic conductor sheet having a large thickness," will be explained. Production of an anisotropic conductor sheet having a thickness substantially equivalent to the conductor portion pitch is the limit of the prior art. By contrast, according to the present invention, there can be produced an anisotropic conductor sheet low in conduction resistance even if the thickness of the sheet is about twice as large as the conductor portion pitch.

The above and other objects, effects, features and advantages of the present invention will become more apparent from the following description of embodiments thereof taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Modes for carrying out the present invention will now be described in detail, but should not be construed as limiting the scope of the present invention.

Figure 16:
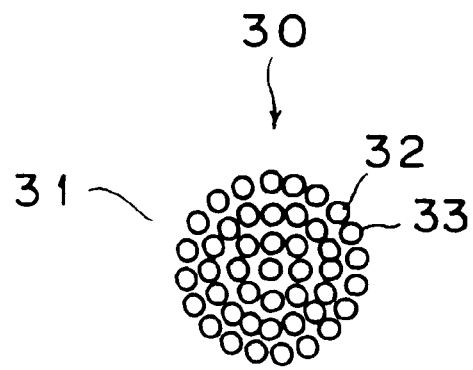
FIG. 16 is a model diagram of the particle arrangement of a conductor portion, viewed from above a surface, in the case of magnetic poles circular in cross section.
Figure 17:
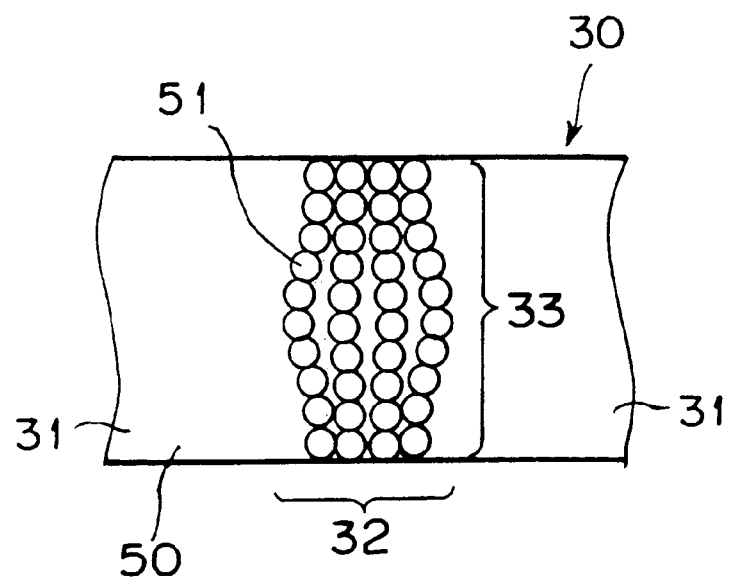
FIG. 17 is a vertical cross-sectional model diagram of the particle arrangement of a conductor portion in the case of magnetic poles circular in cross section.

An anisotropic conductor sheet 30 according to the present invention, the principal parts of which are shown in FIGS. 16 and 17, is a sheet member usually having a thickness of 0.1 to 10 mm, preferably 0.3 to 2 mm, and comprising an insulator portion 31 and a plurality of conductor portions 32 surrounded by the insulator portion 31 and formed in the widthwise direction thereof. The conductor portions 32 are made of aggregates of rows 33 of conductive ferromagnetic particles arranged in the thicknesswise direction of the sheet. The minimum width of each aggregate is smaller than 10 mm.

Figure 1:
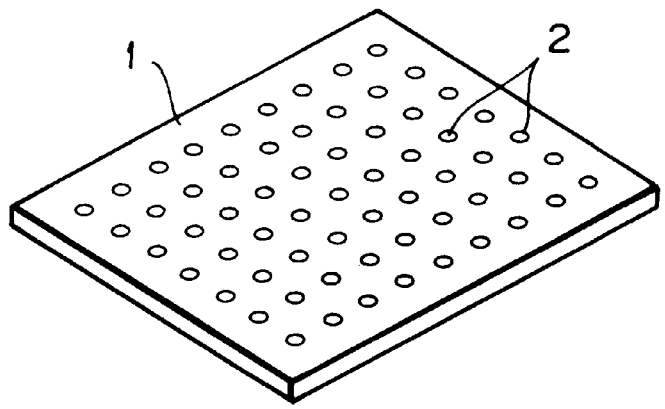
FIG. 1 is a perspective view of the appearance of a conventional anisotropic conductor sheet.
Figure 2:
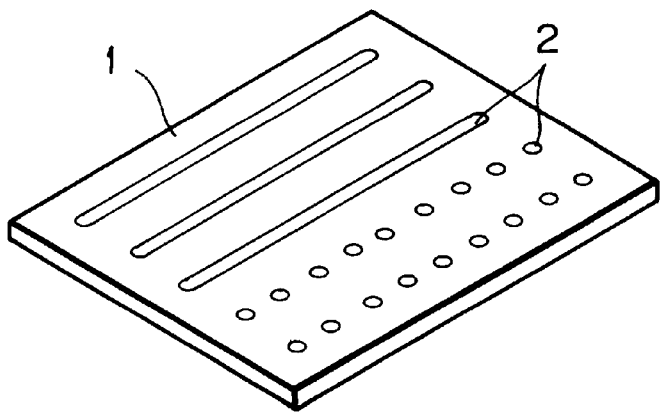
FIG. 2 is a perspective view of the appearance of another conventional anisotropic conductor sheet.
Figure 3:
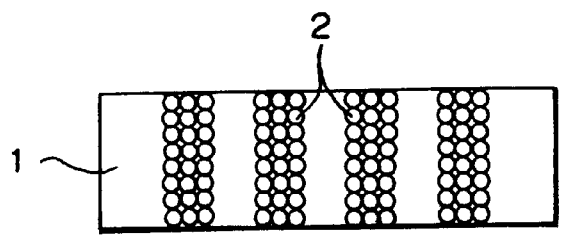
FIG. 3 is a model diagram of a vertical cross section of an anisotropic conductor sheet.
Figure 4:
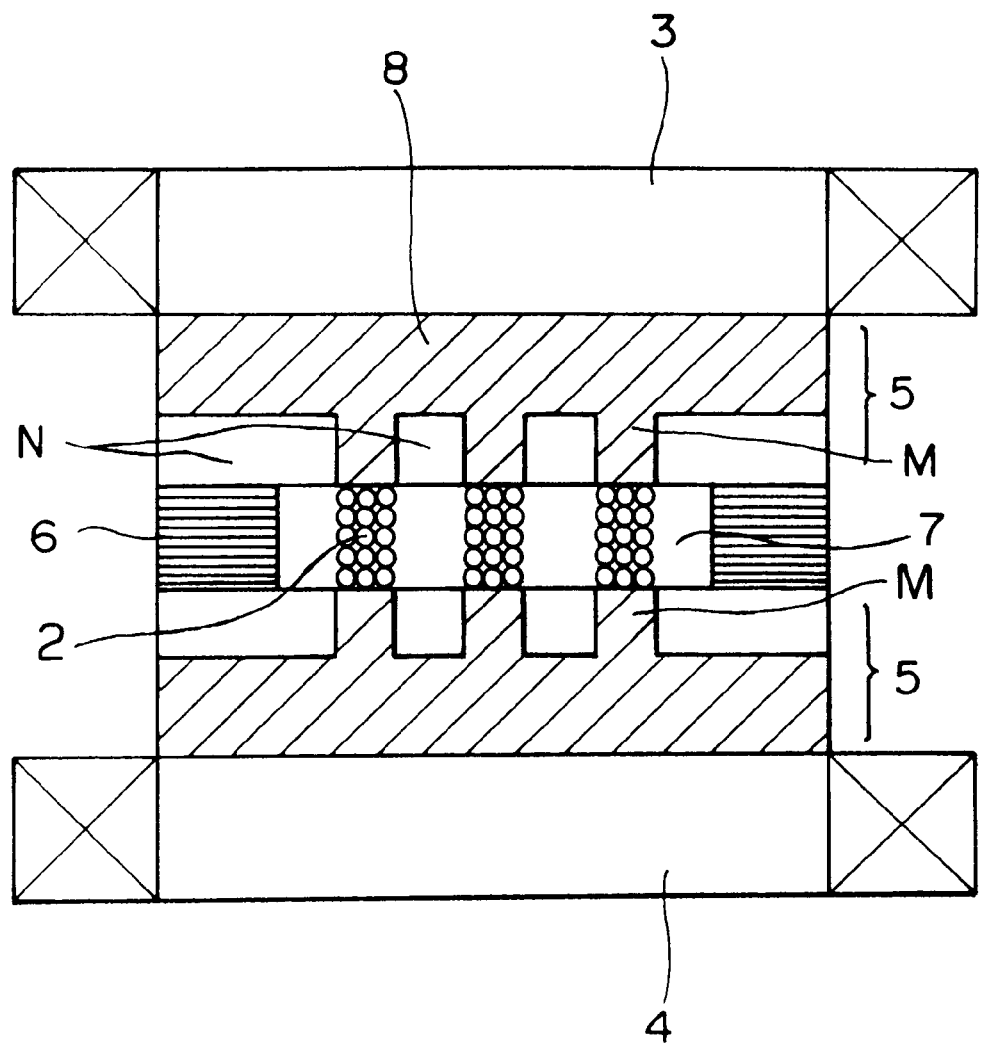
FIG. 4 is a cross-sectional constitutional view of equipment for producing a conventional anisotropic conductor sheet.
Figure 5A:
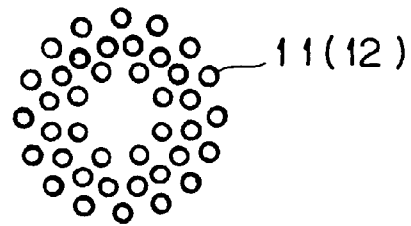
FIG. 5A is a model diagram of a conductor portion, viewed from above a sheet surface, which shows the form of the conductor portion of the sheet in the case of magnetic poles rectangular in cross section in a conventional mold, and the relationship between the form of the magnetic poles of the mold and the magnetic field intensity distribution.
Figure 5B:
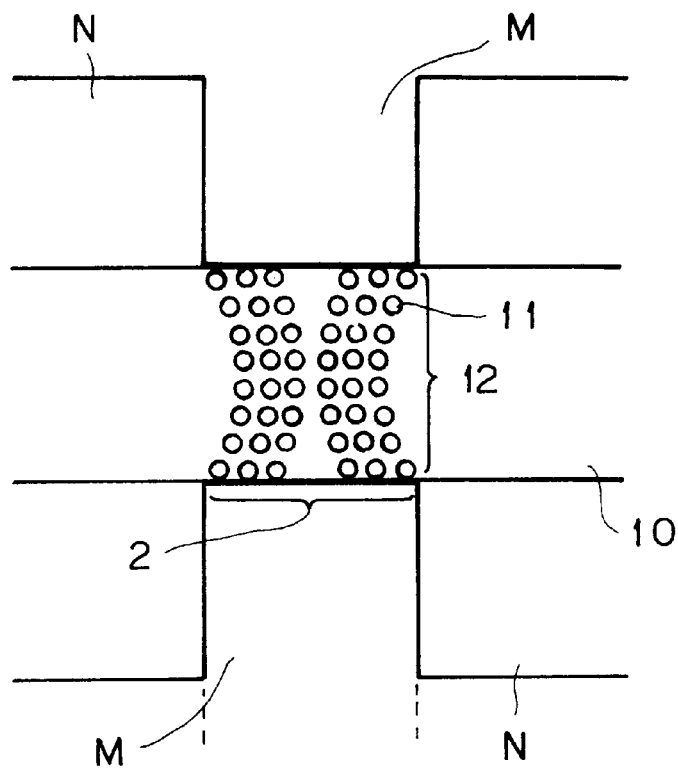
FIG. 5B is a model diagram showing the vertical cross-sectional form of a conductor portion and the form of magnetic poles, which diagram also shows the form of the conductor portion of a sheet in the case of magnetic poles rectangular in cross section in a conventional mold, and the relationship between the form of the magnetic poles of the mold and the magnetic field intensity distribution.
Figure 5C:
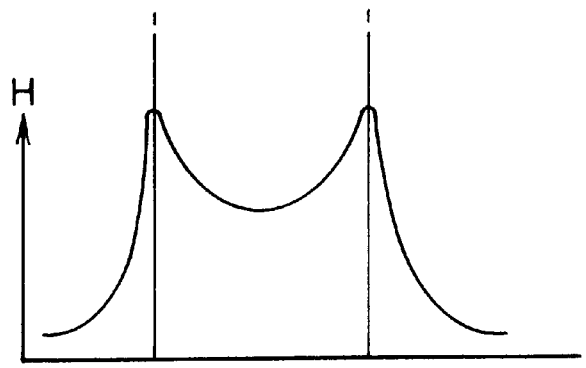
FIG. 5C is a graph showing the magnetic field intensity distribution (Z axis constituent) near the surface of a magnetic pole, which graph also shows the form of the conductor portion in the sheet in the case of magnetic poles rectangular in cross section in a conventional mold, and the relationship between the form of the magnetic poles of the mold and the magnetic field intensity distribution.
Figure 6A:
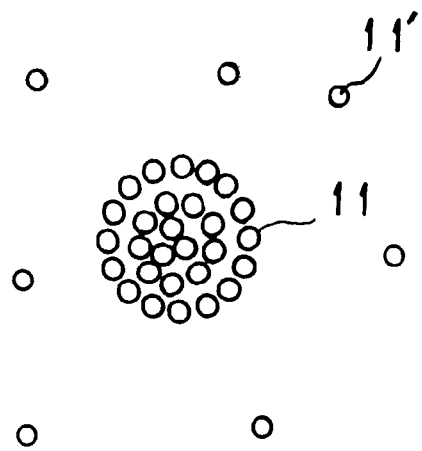
FIG. 6A is a model diagram of a conductor portion, viewed from above a sheet surface, which shows the relationship between the form of the conductor portion in the case of conventional magnetic poles thin and rectangular in cross section and the form of the magnetic poles.
Figure 6B:
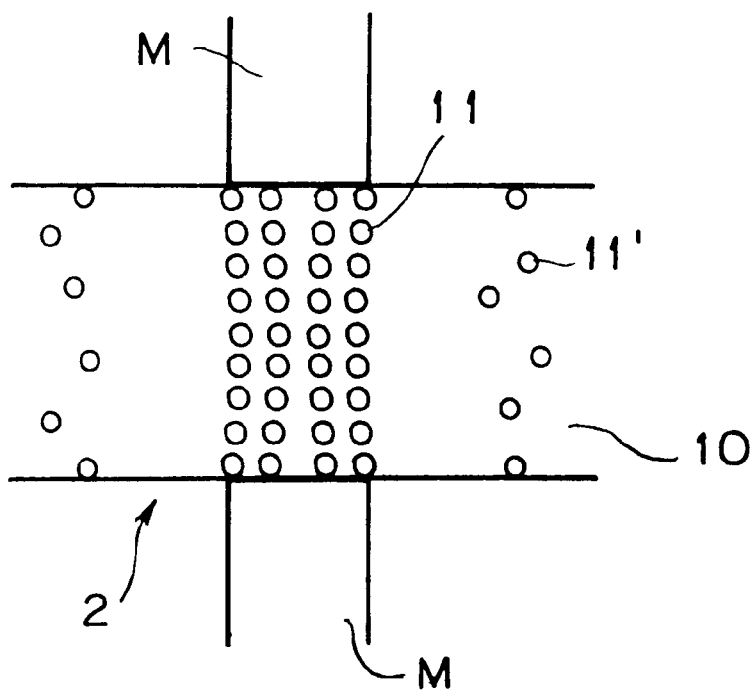
FIG. 6B is a model diagram of a vertical cross section of a conductor portion, which shows the relationship between the form of the conductor portion in the case of conventional magnetic poles thin and rectangular in cross section and the form of the magnetic poles.
Figure 7A:
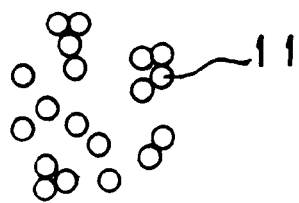
FIG. 7A is a model diagram of a protuberant conductor portion, viewed from above a sheet surface, which shows the relationship between the form of the conductor portion in an anisotropic conductor sheet having protuberant conductor portions (size of protuberant conductor portion<size of magnetic pole) in the case of conventional magnetic poles rectangular in cross section and the form of the magnetic poles.
Figure 7B:
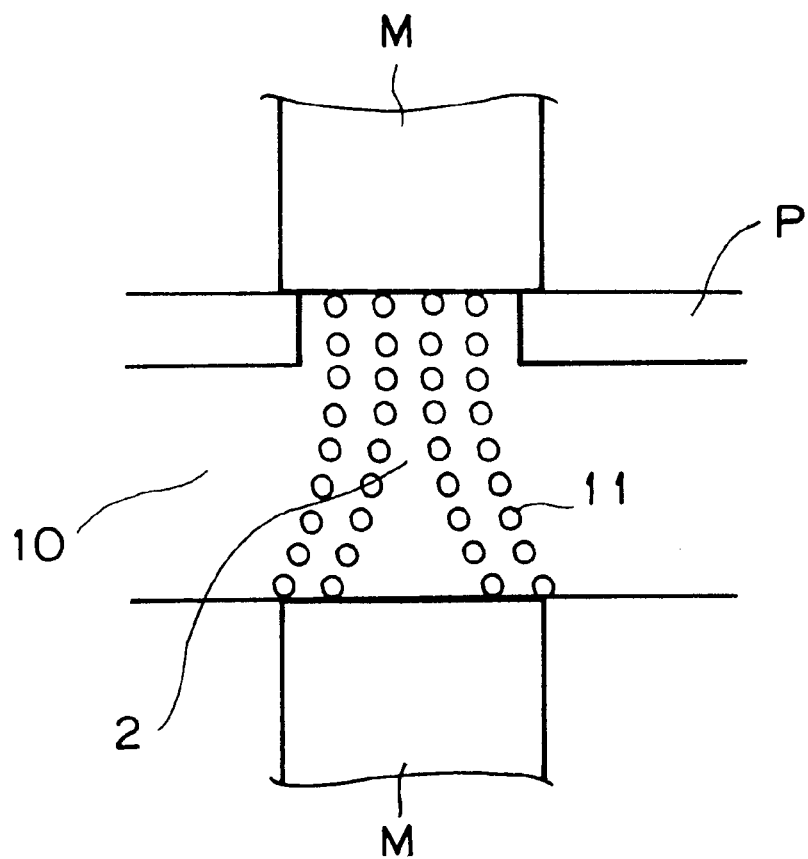
FIG. 7B is a model diagram of a vertical cross section of a conductor portion, which shows the relationship between the form of the conductor portion in an anisotropic conductor sheet having protuberant conductor portions (size of protuberant conductor portion<size of magnetic pole) in the case of conventional magnetic poles rectangular in cross section and the form of the magnetic poles.
Figure 8:
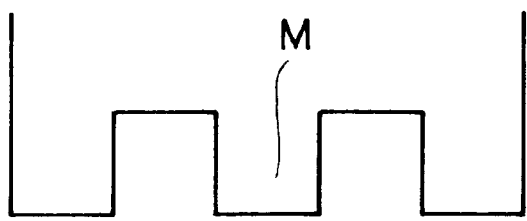
FIG. 8 is a cross-sectional model diagram of model magnetic pole mold pieces having conventional magnetic poles rectangular in cross section.
Figure 8:
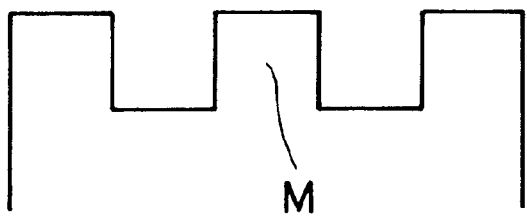
Figure 9:
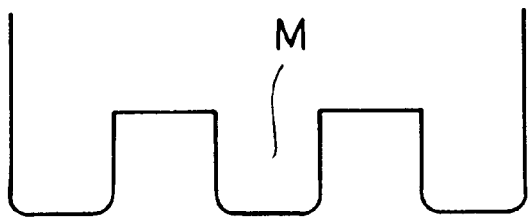
FIG. 9 is a cross-sectional model diagram of model magnetic pole mold pieces having magnetic poles with a rectangular cross section having rounded top corners.
Figure 9:
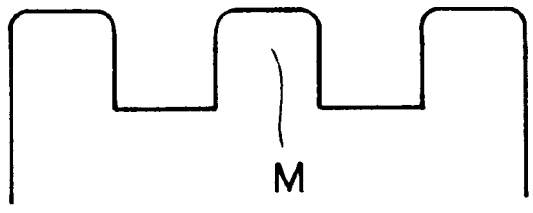
Figure 10:
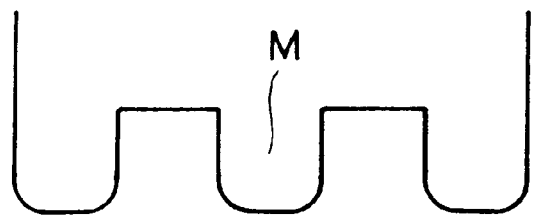
FIG. 10 is a cross-sectional model diagram of model magnetic pole mold pieces having magnetic poles with a cross section having a semicircular top provided with a horizontal straight line portion in the tip thereof.
Figure 10:
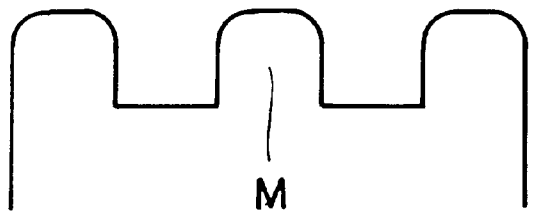
Figure 11:
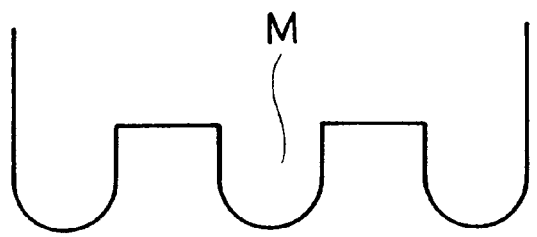
FIG. 11 is a cross-sectional model diagram of model magnetic pole mold pieces having magnetic poles with a cross section having a semicircular top.
Figure 11:
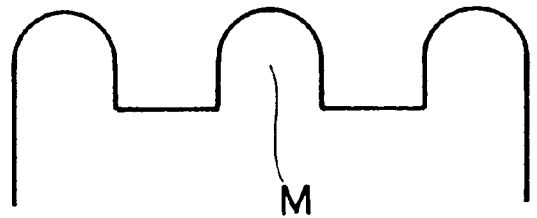
Figure 12:
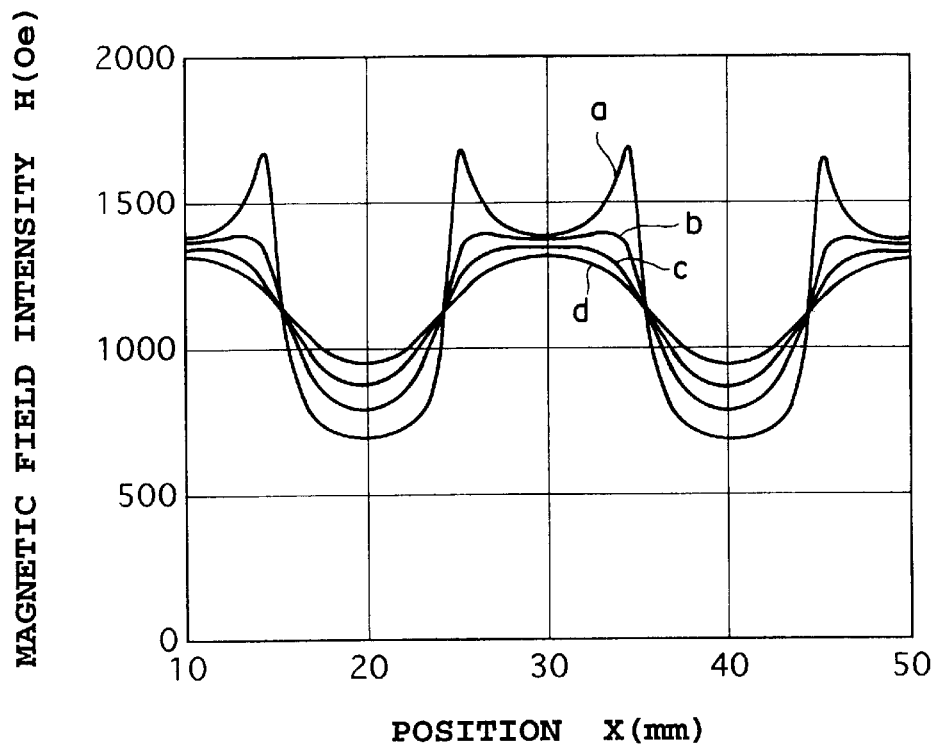
FIG. 12 is a graph showing the results of measurements of magnetic field intensity distributions between opposing magnetic poles rectangular in cross section.
Figure 13:
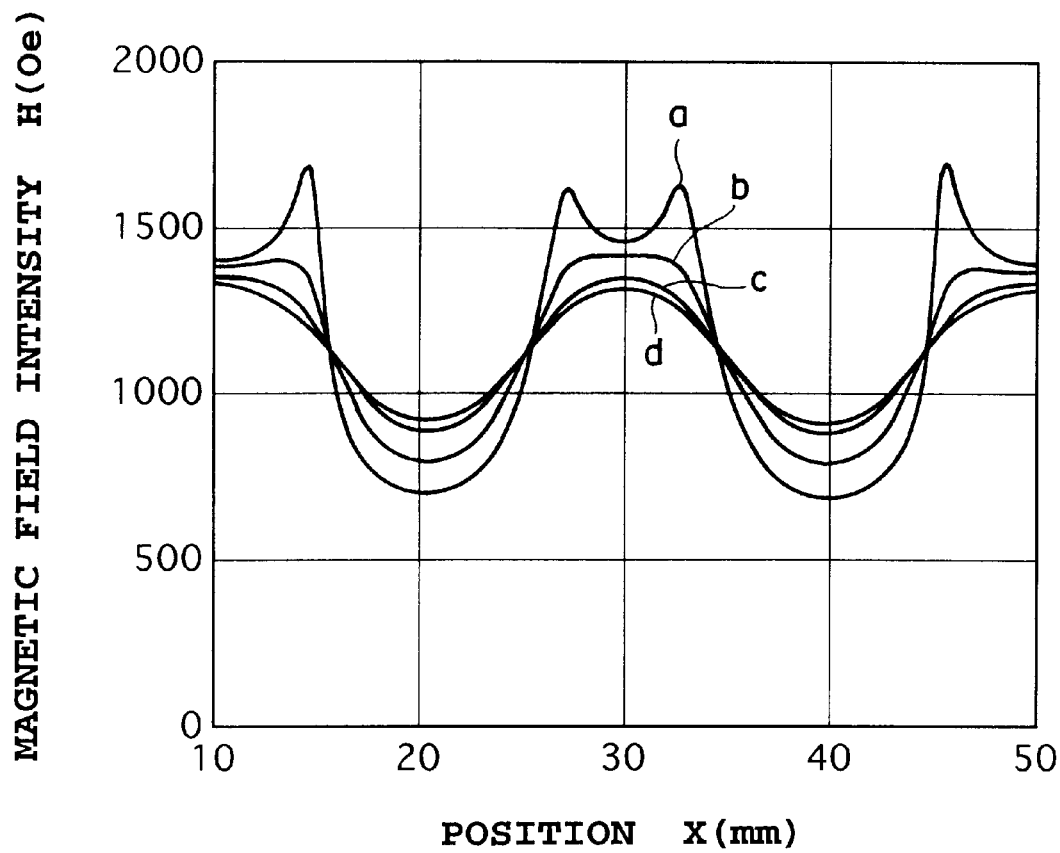
FIG. 13 is a graph showing the results of measurements of magnetic field intensity distributions between opposing magnetic poles with a rectangular cross section having rounded top corners.
Figure 14:
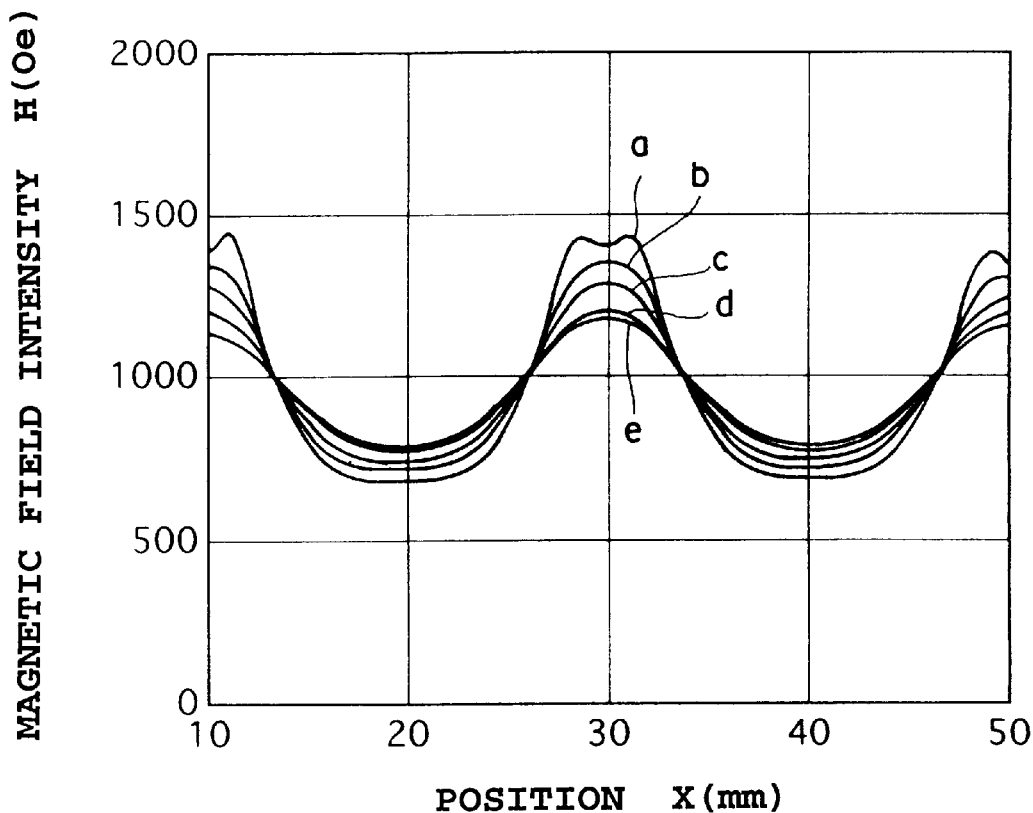
FIG. 14 is a graph showing the results of measurements of magnetic field intensity distributions between opposing magnetic poles with a cross section having a semicircular top provided with a horizontal straight line portion in the tip thereof.
Figure 15:
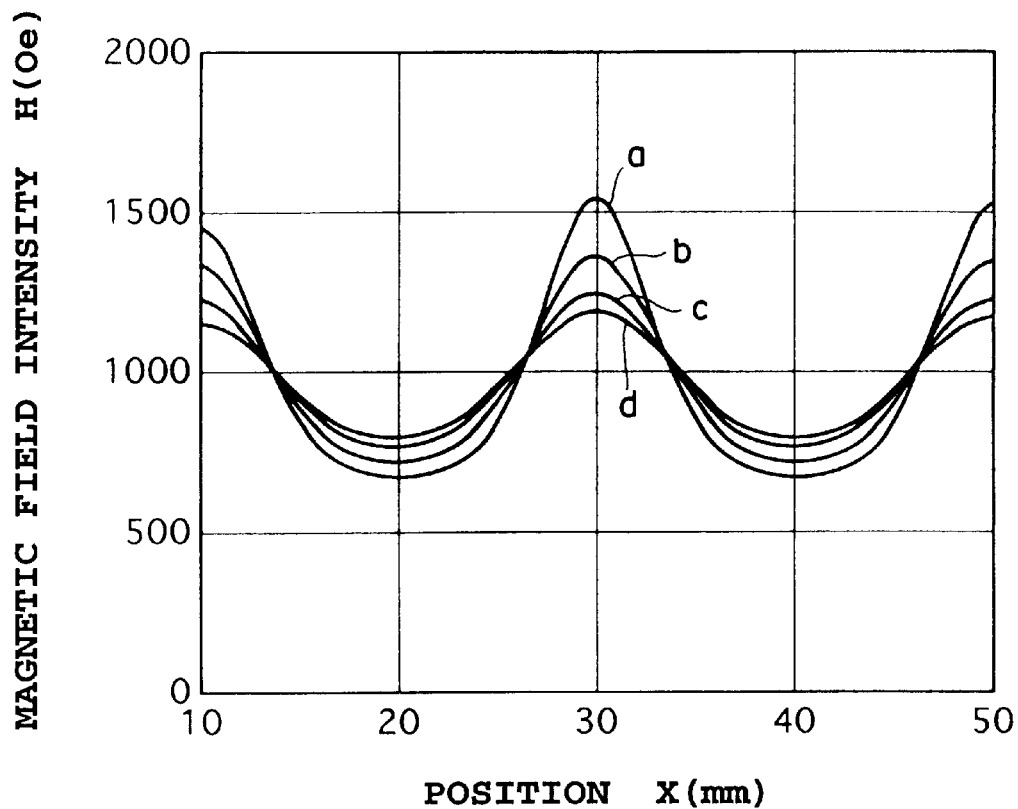
FIG. 15 is a graph showing the results of measurements of magnetic field intensity distributions between opposing magnetic poles circular in cross section.

As shown in FIG. 16, the distribution of the rows 33 of conductive ferromagnetic particles, viewed from above a sheet surface, is characterized by being uniform in aggregate density without any low-density portion inside (FIGS. 5A and 7A show cases where the aggregate density is nonuniform).

Figure 18:
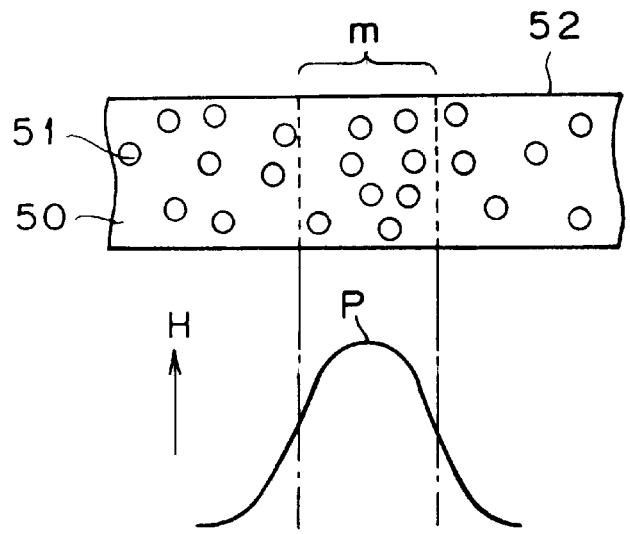
FIG. 18 is a model diagram showing the positional relationship between a magnetic field intensity distribution between opposing magnetic poles of a mold and a portion m where a conductor portion is to be formed in the layer of a molding material.

As shown in FIG. 18, in molding such an anisotropic conductor sheet 30, the magnetic field intensity distribution to be applied to portions m where the conductor portions are to be formed through heating and molding of a molding material 52 comprising conductive ferromagnetic particles 51 mixed in a polymer material 50 must be in a state having the maximum P substantially on the central axis in thicknesswise direction ('Z axis direction) of each portion m of the sheet where a conductor portion is to be formed.

Figure 19:
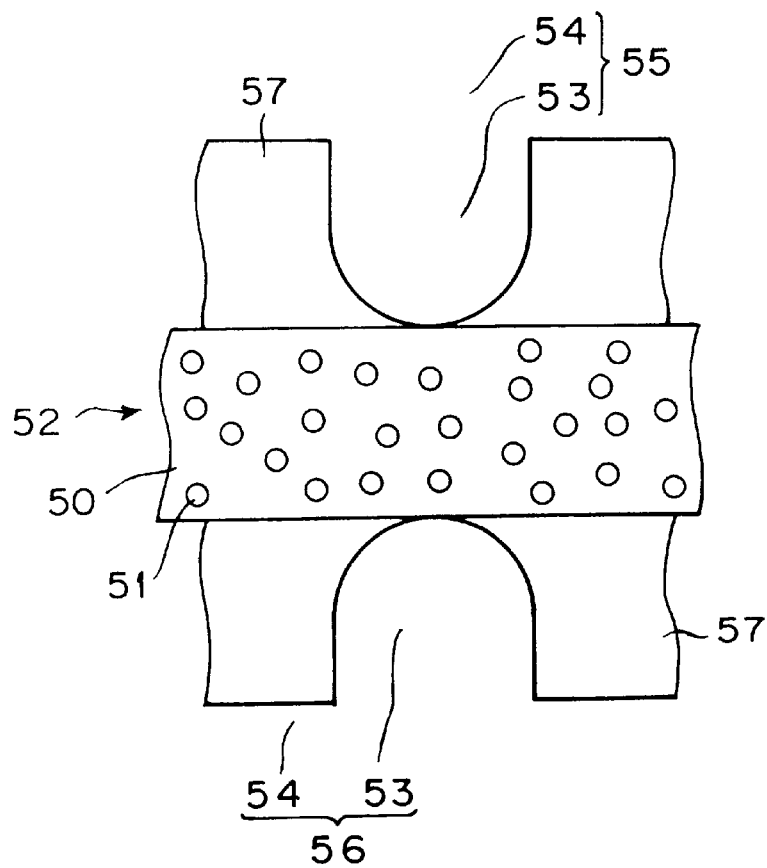
FIG. 19 a model diagram of principal parts when a molding material is placed between opposing magnetic poles of a mold.
Figure 20:
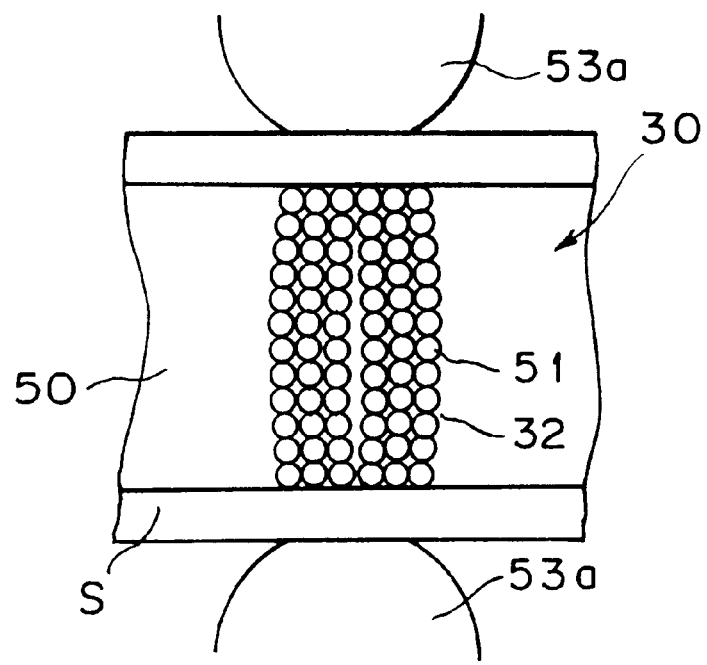
FIG. 20 is a vertical cross-sectional model diagram of the particle arrangement of a conductor portion in the case of magnetic poles with a circular cross section, the top of which is planarized.
Figure 21:
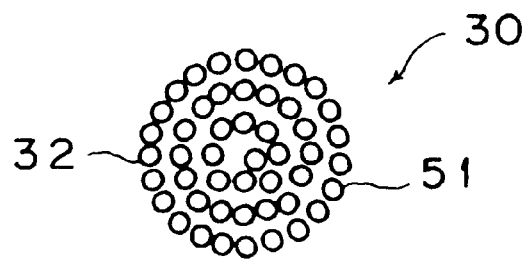
FIG. 21 is a model diagram of the particle arrangement of a conductor portion, viewed from above a surface, in the case of magnetic poles with a circular cross section, the top of which is planarized.
Figure 22A:
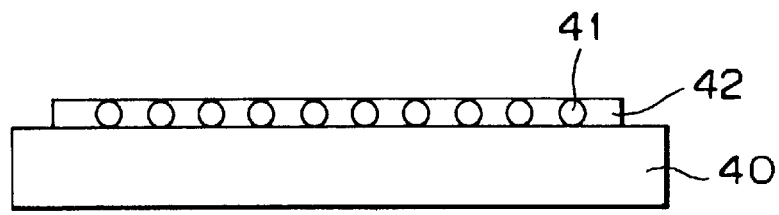
FIG. 22A is a cross-sectional model side view showing an example of a magnetic pole mold piece wherein spherical magnetic micropoles are used.
Figure 22B:
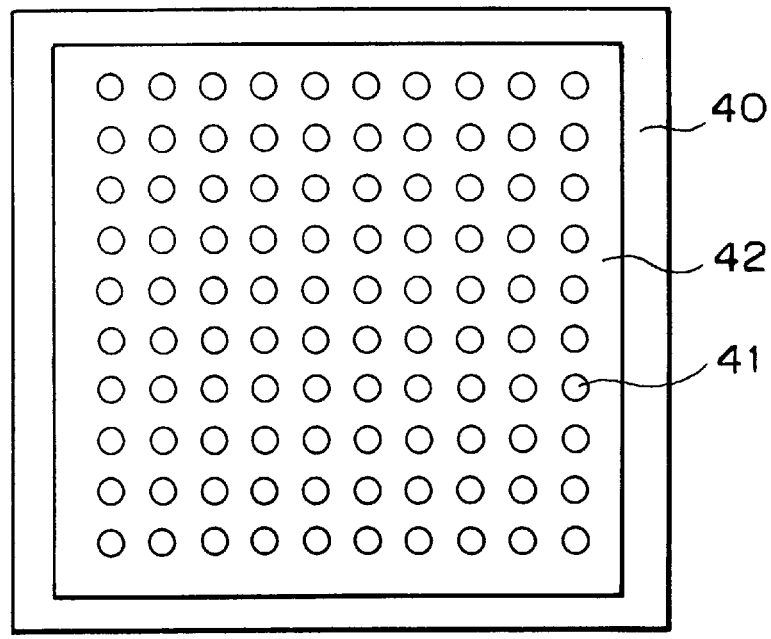
FIG. 22B is a model plan view showing an example of a magnetic pole mold piece wherein spherical magnetic micropoles are used.

As shown in FIG. 19, a specific means for this is characterized in that an anisotropic conductor sheet molding mold, wherein the molding material 52 comprising conductive ferromagnetic particles 51 dispersed in a flowable material or a material 50 having a flowable state under molding conditions is placed to localize the conductive ferromagnetic particles 51, and is then cured to obtain an anisotropic conductor sheet, is constituted of a pair of opposing magnetic pole mold pieces 55 and 56 (also referred to as "mold structures" and used interchangeably) each comprising a mold substrate 54 provided with a plurality of magnetic micropoles 53 made of a ferromagnetic material for localization of magnetic fields, and in that the magnetic micropoles 53 are formed to have a cross-sectional form decreased in width toward the tip thereof along at least one plane vertical to the surfaces of the magnetic pole mold pieces 55 and 56. In this case, the gap portions between said plurality of the magnetic micropoles 53 are made of a nonmagnetic material 57 selected, for example, from among heat-resistant resins such as polyimide resins, epoxy resins and phenolic resins, those materials prepared by blending such a heat-resistant resin with a nonmagnetic heat-resistant filler, and nonmagnetic metals such as copper, aluminum and stainless steel. The magnetic micropoles may alternatively be magnetic micropoles 53a in the form of a member with a circular cross section having the tip thereof planarized as shown in FIG. 20. Such magnetic micropoles 53a are used to form a mold, in which spacers S are inserted between the magnetic poles and the molding material to produce a sheet 30. Ferromagnetic particles 51 are substantially uniformly aggregated in each conductor portion 32 of the resulting sheet 30 as shown in FIGS. 20 and 21. Accordingly, such magnetic micropoles 53a in a form having the tip thereof planarized are also suitable for practical use. Alternatively, the forgoing magnetic micropoles may be provided only in one of the opposing magnetic pole mold pieces, while the other magnetic pole mold piece may be provided with a plane magnetic pole. In this mold, it is desired that a spacer be inserted between the planar magnetic pole and the molding material. When this mold is compared with a mold having both magnetic pole mold pieces provided with magnetic micropoles, the former, though poorer in the performance of localization of conductive ferromagnetic particles, is greatly advantageous in an aspect of anisotropic conductor sheet productivity since registration of the opposing magnetic pole mold pieces becomes unnecessary.
(Materials)

A description will be made while referring to FIGS. 16 to 21. The electrical insulating polymer material 50 flowable when subjected to the action of magnetic fields but then curable during the course of sheet production is used for the insulator portions 31 of the anisotropic conductor sheet 30 of the present invention. More specifically, the polymer material 50 has such a flowability as to enable conductive ferromagnetic particles 51 to be localized toward magnetic micropoles in the course of sheet production, but is then cured to fix therein the conductive ferromagnetic particles 51.

Examples of the polymer material include silicone rubbers, ethylene-propylene rubbers, urethane rubbers, fluororubbers, polyester rubbers, styrene-butadiene rubbers, styrene-butadiene block copolymer rubbers, styrene-isopropylene block copolymer rubbers, and soft epoxy resins. They must be either liquid or flowable at a temperature in the course of sheet production. Preferred are those materials liquid at ordinary temperature but curable by heating to form a solid rubber, such for example as thermosetting silicone rubbers. Those materials flowable in the course of sheet production though solid at ordinary temperature, and capable of being a solid after sheet production may also be used, examples of which include liquid soft epoxy resins, thermoplastic elastomers, and thermoplastic soft resins. Additionally stated, those materials having a cross-linked structure after sheet production are preferred in respect of heat resistance, durability, etc.

It is preferred that they be solid but have a rubber elasticity in a sheet state. A material low in elasticity may be used though it depends on the use application of the resulting sheet. An adhesive or pressure-sensitive adhesive material may also be used though it depends on the use application of the resulting sheet. The kinds of usable polymer materials are not limited to the foregoing examples. Any polymer materials may be used with no particular limitation in so far as they have hitherto been known for use in anisotropic conductor sheets or have a function equivalent or similar to those of the above-mentioned materials.

The conductive ferromagnetic particles 51 constituting the conductor portions 32 of the sheet 30 are particles having a ferromagnetism and having a conductivity at least on the surfaces thereof. More specifically, they may be particles of a simple ferromagnetic metal, composite particles, i.e., particles of a mixture, or particles made of an organic or inorganic material coated with a metal.

Examples of such conductive ferromagnetic particles 51 include particles of a metal exhibiting a ferromagnetism, such as nickel, iron or cobalt; particles of an alloy containing such a metal; such particles covered with gold, silver, copper, tin, palladium, rhodium or the like by plating or the like; and inorganic particles, such as nonmagnetic metal particles or glass beads, or polymer particles subjected to plating of a conductive ferromagnetic metal such as iron, nickel or cobalt. From the standpoint of reducing the production cost, particles of nickel, iron, or an alloy thereof are especially preferred. Particles subjected to gold plating are preferably used in use applications to a socket, a connector, etc. wherein the low conduction resistance thereof as an electrical property is utilized. Whiskers (crystal whiskers) of iron or the like, as well as short fibers of a ferromagnetic metal may alternatively be used as the conductive ferromagnetic particles 51.

Additionally stated, the anisotropic conductor sheet of the present invention is produced as an individual product in itself, and is mainly aimed at an article to be handled individually. However, the constitution of the present invention is such that the sheet of the present invention can be easily used in a circuit board device comprising a circuit board and an anisotropic conductive connector layer integrally formed therewith on the surface of the lead electrode domain of the circuit board, for example, as disclosed in Japanese Patent Application Laid-open No. 151,889/1992, and such that the process of the present invention can also be easily applied to the method of producing a circuit board device, as disclosed in the official gazette of the same Japanese Patent Application Laid-open.

Embodiment 1

A method of producing an anisotropic conductor sheet of 1 mm in thickness wherein 961 (31×31) columnar conductor portions of about 0.4 mmφ in diameter, made of conductive ferromagnetic particles, are arranged like a square lattice at a pitch of 1 mm.

(Method of Forming Mold)

A flat iron plate mold provided with conventional magnetic micropoles rectangular in vertical cross section was once produced, and then subjected to spherical surface formation of the tops of the magnetic micropoles while using an electric discharge machine of a molding electrode type.

Figure 23:
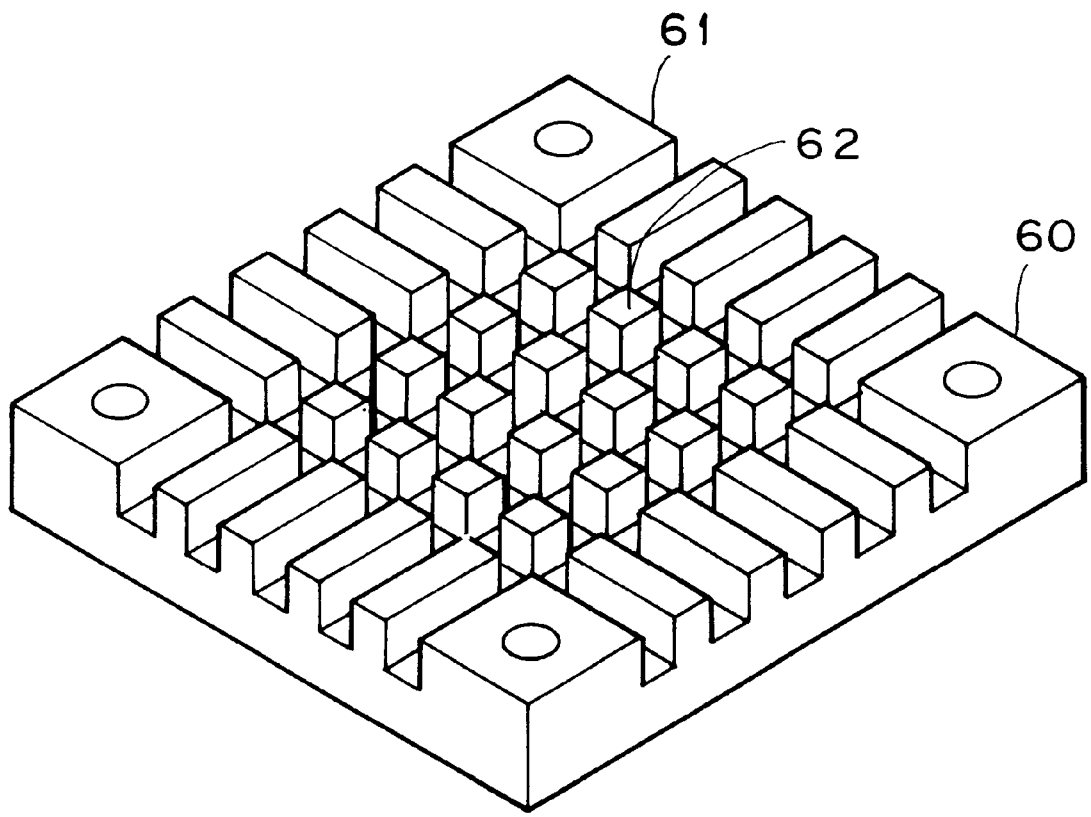
FIG. 23 is a perspective view of a conventional mold substrate and also a perspective view of a mold substrate in a middle stage of production of a mold in a first embodiment of the present invention.

As shown in FIG. 23, two flat iron plates as ferromagnetic materials having a thickness of 5 mm, a longitudinal length of 50 mm and a lateral length of 50 mm were used as a pair of mold substrates 60. 32 longitudinal grooves and 32 lateral grooves 61 each having a depth of 1 mm and a width of 0.4 mm were formed gridwise in a surface portion of each substrate. Square columnar portions surrounded by these grooves 61 were conventional magnetic micropoles 62 rectangular in cross section.

Figure 24:
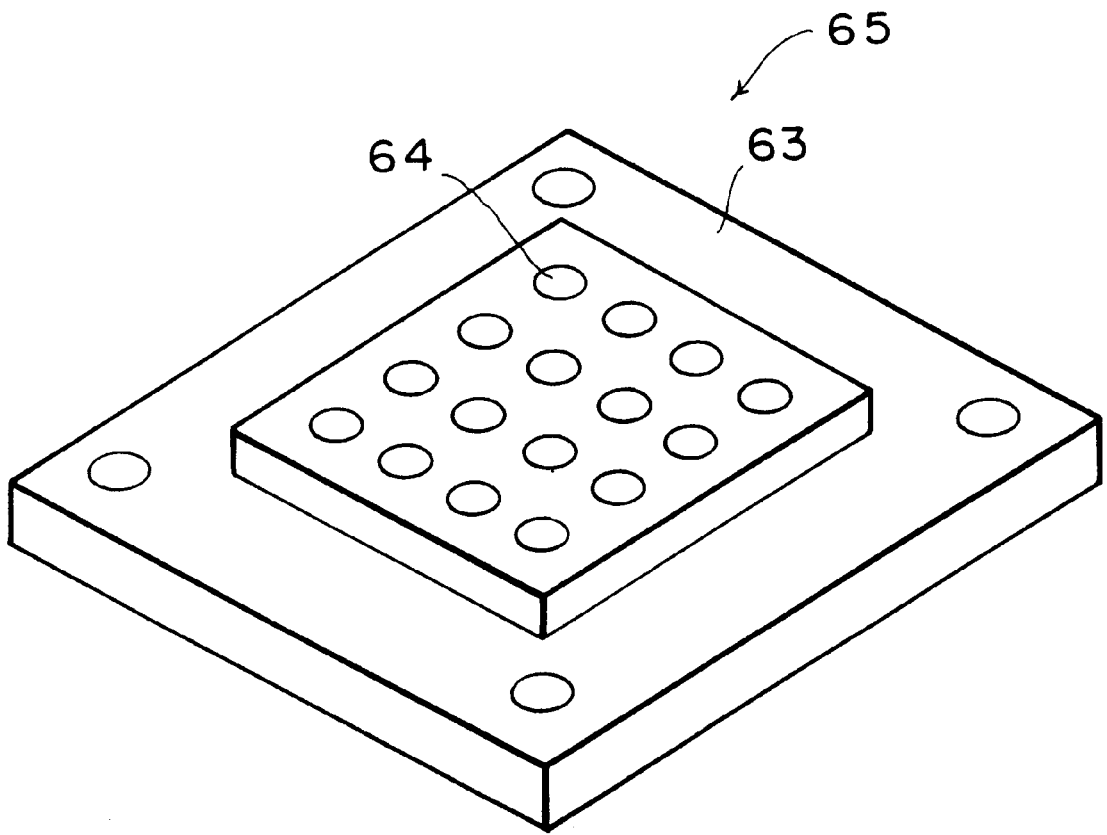
FIG. 24 is a perspective view of a molding electrode for use in an electric discharge machine for forming magnetic micropoles, which explains the first embodiment of the present invention.
Figure 25A:
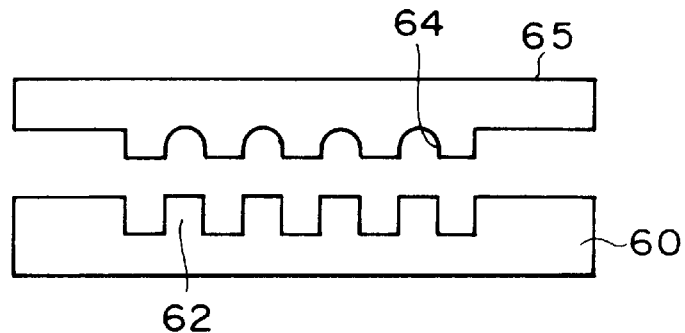
FIG. 25A is a cross-sectional model diagram of the mold substrate and the molding electrode for use in the electric discharge machine in registration with each other, which explains the first embodiment of the present invention.
Figure 25B:
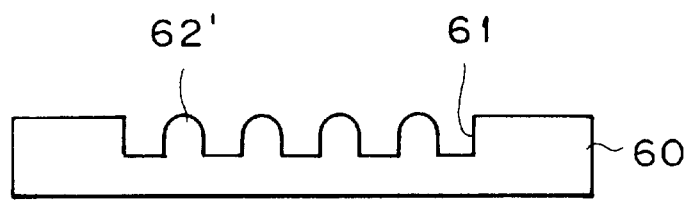
FIG. 25B is a cross-sectional model diagram of a mold substrate after curving of the tops of magnetic micropoles, which explains the first embodiment of the present invention.

A flat plate electrode material 63 was used, in a surface portion of which 961 holes 64 each having a semispherical surface and a top end diameter of 0.6 mm and corresponding to the magnetic micropoles 62 were formed in square lattice arrangement at a pitch of 1 mm as shown in FIG. 24. The resulting electrode material was used as a frame electrode 65 for use in an electric discharge machine in order to subject the top portions of the magnetic micropoles 62 to spherical surface formation. The frame electrode 65 was attached to the electric discharge machine, and then placed in registration with the mold substrate 60 as shown in FIG. 25A. The top portions of the magnetic micropoles 62 were subjected to spherical surface formation as shown in FIG. 25B through electric discharge machining.

Figure 25C:
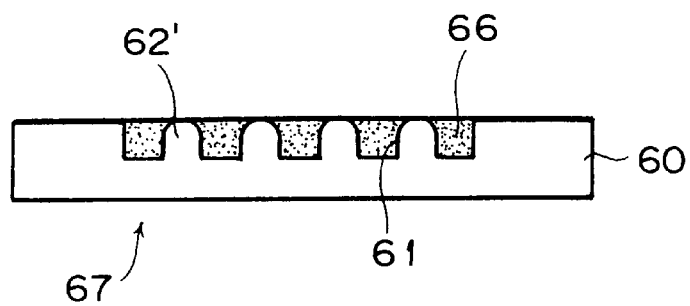
FIG. 25C is a cross-sectional model diagram of a complete mold, which explains the first embodiment of the present invention.

Subsequently, an epoxy resin 66 filled with an aluminum filler was filled in the grooves 61 of the mold substrate 60 having magnetic micropoles 62' having the tops thereof subjected to spherical surface formation to planarize the mold surface of the mold substrate 60 as shown in FIG. 25C, whereby a magnetic pole mold piece 67 was fabricated, which was suitable for molding an anisotropic conductor sheet having insular conductor portions in square lattice arrangement.

Further, a square nonmagnetic stainless steel frame having a thickness of 1 mm, an outer side length of 50 mm and an inter side length of 35 mm was sandwiched between a pair of such magnetic pole mold pieces, and was used as a spacer for forming a molding space of an anisotropic conductor sheet. Holes of 4 mmφ in diameter for registration pins were formed through the four corner portions of each of the two mold substrates and the spacer in order to enable accurate mutual registration of them.

(Molding of Anisotropic Conductor sheet)

Figure 26:
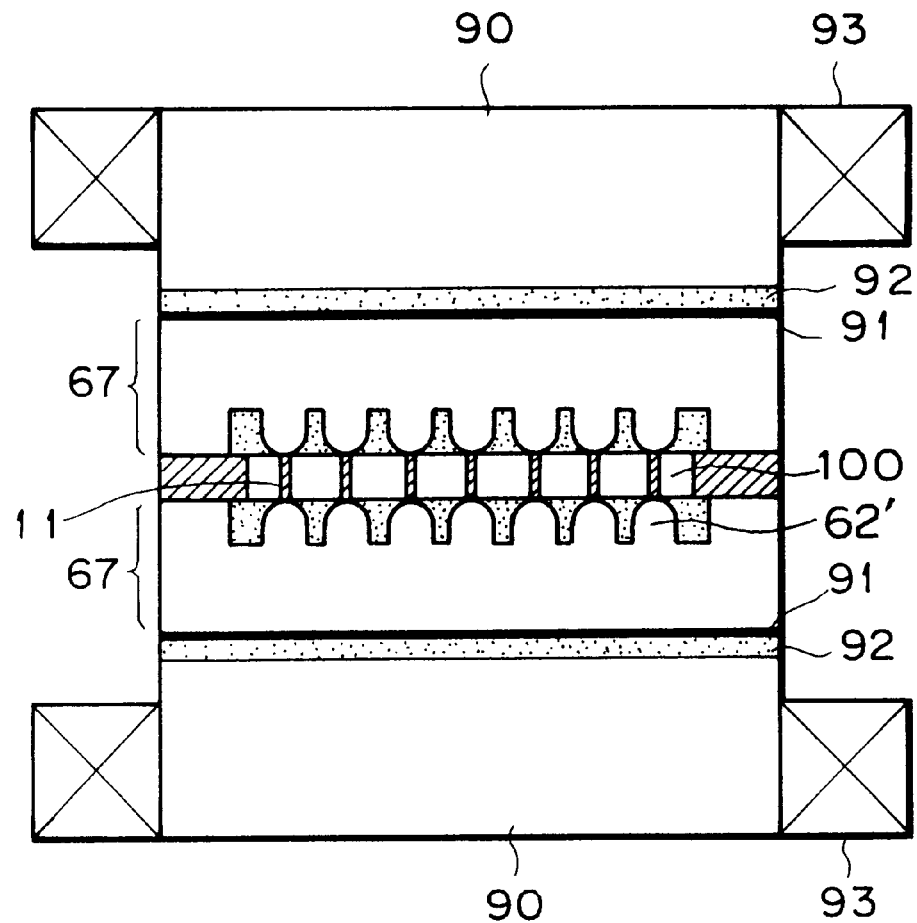
FIG. 26 is a cross-sectional model diagram showing a state in which a sheet is being molded with a mold attached to an electromagnet apparatus, which diagram explains the first embodiment of the present invention.

A thermosetting silicone rubber was mixed with 10 vol. % of conductive ferromagnetic nickel particles plated with gold and having an average particle size of 40 μm to effect homogeneous dispersion to prepare a flowable molding material, which was then filled in the molding space formed between the pair of magnetic pole mold pieces 67 by the spacer (see FIG. 26).

As shown in FIG. 26, the mold pieces 67 filled with the molding material were disposed between a pair of opposing planar magnetic poles 90 of an electromagnet apparatus 93 in a state of close contact therebetween. Plate heaters 91 for mold heating were respectively attached to the surfaces of the pair of the magnetic poles 90 of the electromagnet apparatus with heat insulating layers 92 therebetween. When the mold pieces 67 were thus disposed, the mold pieces 67 became part of the magnetic poles of the electromagnet 93, whereby a pair of opposing surfaces provided with the magnetic micropoles 62' (same as 53 in FIG. 19) became a new pair of magnetic pole surfaces of the electromagnet 93. Hereinafter, the resulting new magnetic poles are expressed as magnetic pole mold pieces to be distinguishable from the magnetic poles 90 of the electromagnet apparatus.

Next, the electromagnet 93 was excited so that magnetic fields with a magnetic field intensity distribution formed by each pair of magnetic micropoles 62' were generated in the molding space filled with the molding material 100 between the pair of magnetic pole mold piece surfaces to localize the conductive ferromagnetic particles 51 dispersed in the molding material 100 in a columnar form (see FIG. 17). The excitation magnetic field intensity and the excitation time are dependent on many factors such as the viscosity and curing time of the molding material 100, the material, shape and size of the conductive ferromagnetic particles 51, the shape and size of the magnetic micropoles 62' of the molds 67, and the thickness of the resulting anisotropic conductor sheet. Herein, the electromagnet was excited to provide an average magnetic field intensity of about 50 kOe between the magnetic pole mold pieces, whereby localization of the conductive ferromagnetic particles 51 was advanced at room temperature for 10 minutes. Thereafter, the mold temperature was elevated to 100° C. and maintained at 100° C. for 30 minutes while using the mold heaters, whereby the molding material 100 was cured while further advancing the localization. Subsequently, the electromagnet 93 was de-excited to a magnetic field intensity of zero. The mold pieces 67 were demounted, and then opened when the mold temperature was lowered to about 70° C., followed by withdrawal of the resulting anisotropic conductor sheet. When this sheet was observed from above a surface with a microscope, the aggregate density of particles in each particle aggregate was uniform. On the other hand, when the cross section of each aggregate portion was observed, particles were aggregated in a columnar form. This sheet was sufficiently low in conduction resistance.

Embodiment 2

A method of producing an anisotropic conductor sheet of 1 mm in thickness wherein 31 zonal conductor portions of about 0.2 mm in width are arranged in parallel with one another at a pitch of 1 mm.

Figure 27:
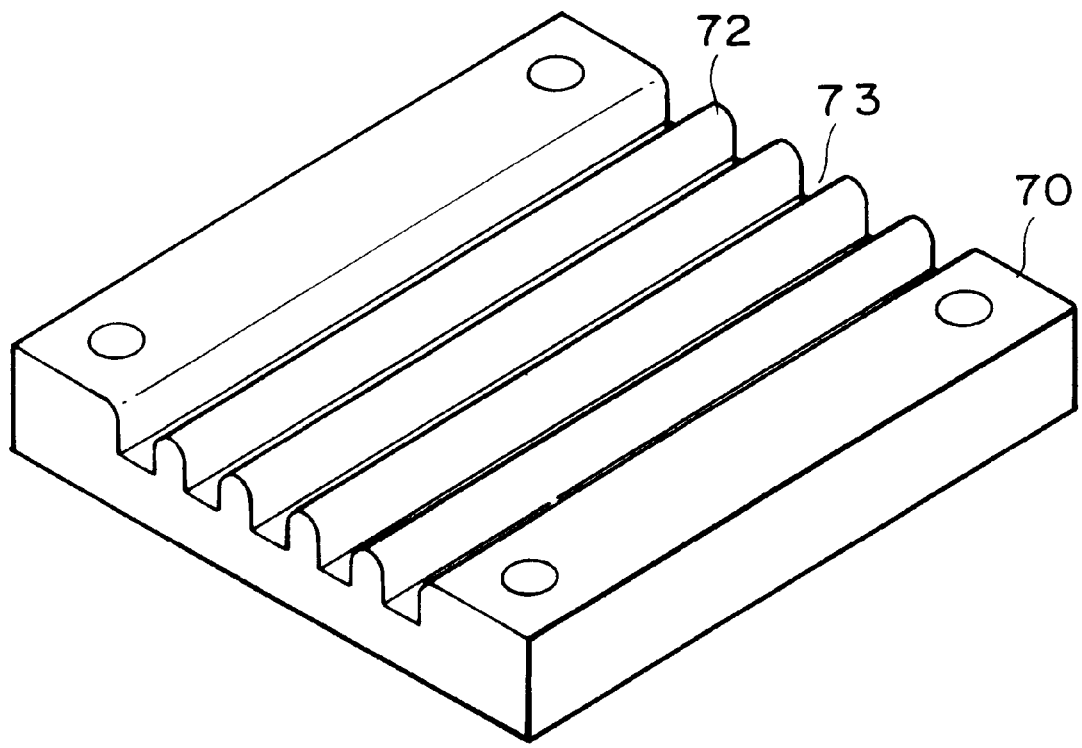
FIG. 27 is a perspective view of a mold substrate, which explains a second embodiment of the present invention.

As shown in FIG. 27, two flat ferromagnetic iron plates having a thickness of 5 mm, a longitudinal length of 50 mm and a lateral length of 50 mm as a pair of mold substrates 70 were each subjected to machining of each surface portion with a wire electric discharge machine capable of functional curve machining to form 31 linear magnetic micropoles 72 with a top semicircular in vertical cross section in parallel with one another at a pitch of 1 mm. The grooves 73 were filled with an epoxy resin blended with an aluminum filler (not shown in the figure) to planarize the surfaces of mold pieces, whereby a mold was fabricated, which was suitable for molding an anisotropic conductor sheet having zonal conductor portions. The vertical cross-sectional form of each magnetic micropole 72 had a height of 1 mm, a uniform width of 0.6 mm between the bottom surface and a height of 0.7 mm, and a semicircular top of 0.3 mm in radius above the height of 0.7 mm.

On the other hand, a square nonmagnetic stainless steel frame having a thickness of 1 mm, an outer side length of 50 mm and an inter side length of 35 mm was sandwiched between a pair of magnetic pole mold pieces, and was used as a spacer for forming a molding space of an anisotropic conductor sheet. Holes of 4 mmφ in diameter for registration pins were formed through the four corner portions of each of the two mold substrates and the spacer in order to enable accurate mutual registration of them.

While using these mold substrates, substantially the same procedure as in Embodiment 1 was repeated to produce an anisotropic conductor sheet. The surface of the resulting sheet and the cross section of each particle aggregate portion thereof were substantially the same as in Embodiment 1. This sheet was sufficiently low in conduction resistance.

Embodiment 3

Figure 28:
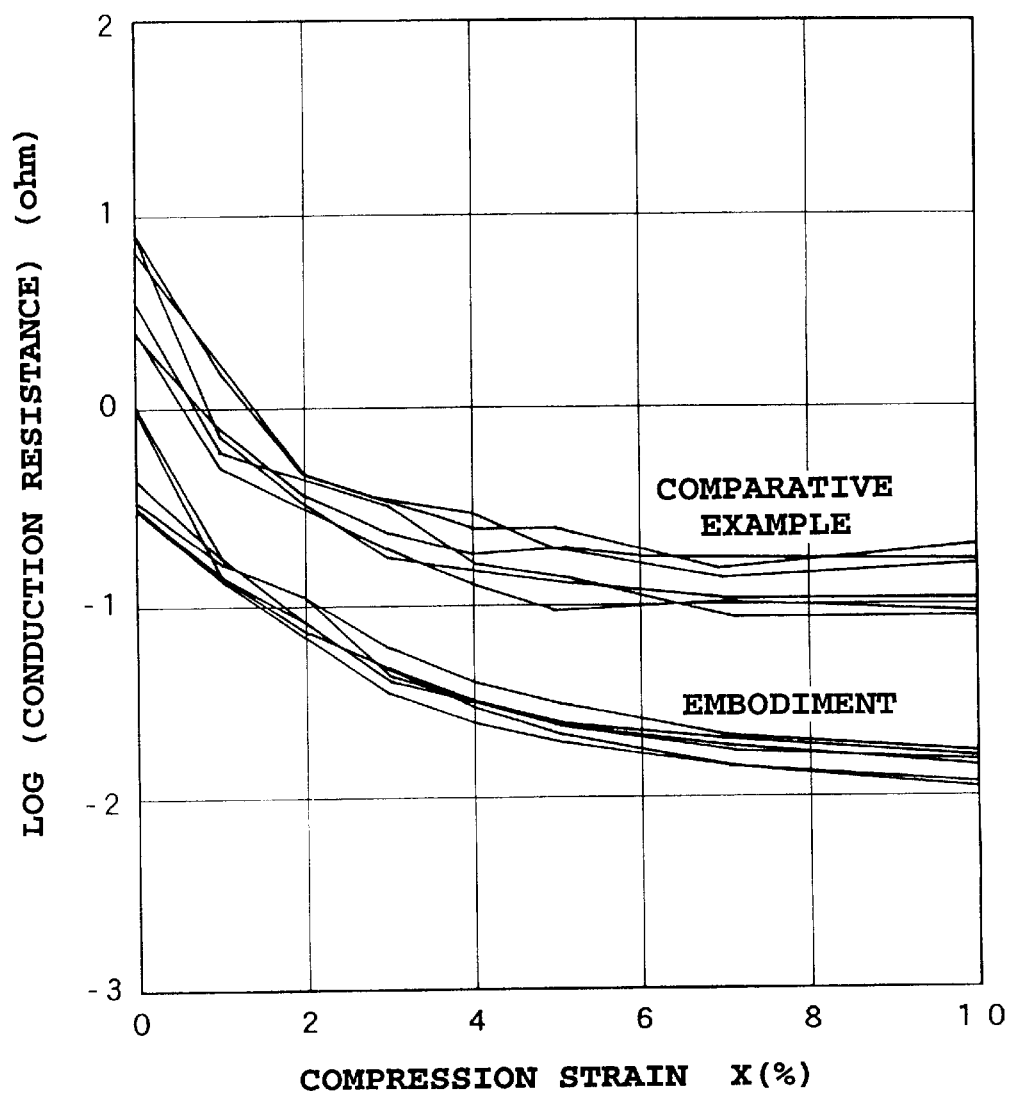
FIG. 28 is a graph showing the dependence of conduction resistance on compression strain in conductor portions of each of an anisotropic conductor sheet according to the present invention and a conventional anisotropic conductor sheet.

Substantially the same procedure as in Embodiment 1 was repeated to produce a sheet having a thickness of 0.7 mm, a conductor portion diameter of 0.5 mmφ and a conductor portion pitch of 1.27 mm. Further, a sheet of Comparative Example having the same dimensions was produced using a conventional mold. FIG. 28 shows the results of measurements of the dependence of conduction resistance on compression strain in conductor portions for these sheets. The measurements were made for 6 conductor portions of each sheet at room temperature. The results of measurements were distinctly divided into two groups respectively corresponding to the sheet produced by the process of the present invention and the sheet produced by the conventional method. The upper group is the results of measurements for the anisotropic conductor sheet produced by the conventional method, while the lower group is the results of measurements for the anisotropic conductor sheet produced by the process of the present invention. As is apparent from these results, it is understood that the conduction resistance of the anisotropic conductor sheet produced by the process of the present invention is an order of magnitude smaller than that of the anisotropic conductor sheet produced by the conventional method.

Embodiment 4

(Formation of Mold)

961 (31×31) perforations of 0.06 mm in diameter were formed in square lattice arrangement at a pitch of 1 mm through a central portion of a 50 mm-square aluminum plate of 0.60 mm in thickness. Steel balls of 0.60 mm in diameter were respectively placed on and then loaded into all the perforations while using a press. A stainless steel sheet of 20 μm in thickness was bonded to one surface of the aluminum plate with an adhesive, while the other surface of the aluminum plate was fixed to a 50 mm-square iron mold substrate of 5 mm in thickness, whereby a magnetic pole mold piece was fabricated. Two such magnetic pole mold pieces were fabricated, and positioned in such a way that the stainless steel sheet surfaces thereof faced each other with accurate face-to-face positioning of corresponding steel balls in square lattice arrangement on both the surfaces. A square stainless steel frame having an outer side length of 50 mm, a frame width of 5 mm and a thickness of 1 mm was sandwiched between the pair of the magnetic pole mold pieces, and was used as a spacer for forming a molding space of an anisotropic conductor sheet.

(Molding of Anisotropic Conductive Sheet)

Substantially the same procedure as in Embodiment 1 except for use of the mold pieces fabricated in the foregoing manner was repeated to produce an anisotropic conductor sheet having 31×31 aggregates of ferromagnetic particles at a pitch of 1 mm. When the surface of such an aggregate in this sheet was observed with a microscope, the dispersion state in the aggregate of particles was uniform with no particle-free portion recognized therein. In other words, the aggregate density of the particles was uniform. Further, no ferromagnetic particles were recognized between aggregates.

This anisotropic conductor sheet was cut in the thicknesswise direction through the center of an aggregate of particles to observe the aggregate state of the particles. The result was substantially the same as in FIG. 17, but the columnar aggregate of the particles was in a little bulged form in a middle portion thereof in the thicknesswise direction of the sheet. This sheet was sufficiently low in conduction resistance.

As described hereinbefore, the present invention can provide an anisotropic conductor sheet so low in conduction resistance as to be used for mounting it in an electric circuit such as a socket or a connector, an anisotropic conductor sheet comprising conductor portions having conductive ferromagnetic particles localized densely even up to central portions thereof, an anisotropic conductor sheet of such a pressure sensitive conductive type as to enable a good electric connection to be attained even with a small compression dislocation thereof, and an anisotropic conductor sheet having a large thickness.

The present invention has been described in detail with respect to preferred embodiments, and it will be that changes and modifications may be made without departing from the invention in its broader aspects, and it is the invention, therefore, in the appended claims to cover all such changes and modifications as fall within the true spirit of the invention.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A magnetic pole mold structure for localization of ferromagnetic particles in an anisotropic conductor sheet, said magnetic pole mold structure comprising:

a plurality of magnetic micropoles made of a ferromagnetic material and dispersed in an array pattern on a top surface of said mold structure; and wherein each magnetic micropole of said plurality of magnetic micropoles has a hemispherically-shaped tip portion in a direction perpendicular to said top surface of said mold structure.

2. The magnetic pole mold structure of claim 1, wherein said magnetic micropoles are spherically-shaped.

3. The magnetic pole mold structure of claim 1, wherein a constituent perpendicular to every plane parallel with magnetic pole surfaces of said magnetic pole mold structure in a molding space in a magnetic field intensity distribution on said every plane has a maximum substantially on a central axis of each magnetic micropole.

4. A magnetic pole mold structure for localization of ferromagnetic particles in an anisotropic conductor sheet, said magnetic pole mold structure comprising:

a plurality of magnetic micropoles made of a ferromagnetic material and dispersed in an array pattern on a top surface of said mold structure; and wherein a cross section of each magnetic micropole of said plurality of magnetic micropoles along a plane perpendicular to said top surface of said mold structure and passing through a center of each magnetic micropole is in a form of one of:

(a) a cross section having a decreasing width toward a tip portion of each micropole, wherein there is an increase in a decreasing rate of said width from a base portion towards said tip portion of each micropole and there is nonexistence in said cross section at said tip portion of any straight line portions parallel to said top surface, and (b) a cross section having a decreasing width toward a tip portion of each micropole, wherein there is an increase in a decreasing rate of said width from a base portion towards said tip portion of each micropole and there is in said cross section at a top portion of said tip portion a straight line portion parallel to said top surface and shorter than 50% of a maximum width of said cross section.

5. The magnetic pole mold structure of claim 4, wherein a constituent perpendicular to every plane parallel with magnetic pole surfaces of said magnetic pole mold structure in a molding space in a magnetic field intensity distribution on said every plane has a maximum substantially on a central axis of each magnetic micropole.

6. An apparatus for producing an anisotropic conductor sheet, said apparatus comprising:

a pair of magnets;

a pair of opposing magnetic pole mold structures, provided between respective of said pair of magnets and magnetically coupled therewith, and wherein each mold structure of said pair of mold structures is provided with a plurality of magnetic micropoles dispersed in an array pattern over top surfaces of said mold structures and made of a ferromagnetic material for localization of magnetic fields between said pair of mold structures; and heating means provided between respective of said pair of magnets and said pair of mold structures;

wherein a molding material containing conductive ferromagnetic particles dispersed in a curable material and flowable under molding conditions is placed between said pair of mold structures, said conductive ferromagnetic particles in said molding material are localized with said pair of mold structures, said molding material is heated and cured with said heating means, a cross section of each magnetic micropole of said plurality of magnetic micropoles along a plane perpendicular to said top surfaces of said pair of mold structures and passing through a center of each magnetic micropole is in a form of one of:

(a) a cross section having a decreasing width toward a tip portion of each micropole, wherein there is an increase in a decreasing rate of said width from a base portion towards said tip portion of each micropole and there is nonexistence in said cross section at said tip portion of any straight line portions parallel to said top surfaces, and (b) a cross section having a decreasing width toward a tip portion of each micropole, wherein there is an increase in a decreasing rate of said width from a base portion towards said tip portion of each micropole and there is in said cross section at a top portion of said tip portion a straight line portion parallel to said top surfaces and shorter than 50% of a maximum width of said cross section.

7. The apparatus of claim 6, wherein a constituent perpendicular to every plane parallel with magnetic pole surfaces of said magnetic pole mold structure in a molding space in a magnetic field intensity distribution on said every plane has a maximum substantially on a central axis of each magnetic micropole.

* * * * *